(12) United States Patent
Koyama et al.

(10) Patent No.: US 6,295,047 B1
(45) Date of Patent: Sep. 25, 2001

(54) PERIPHERAL DRIVER CIRCUIT OF LIQUID CRYSTAL ELECTRO-OPTICAL DEVICE

(75) Inventors: Jun Koyama; Yasushi Ogata, both of Kanagawa; Shunpei Yamazaki, Tokyo, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/300,599

(22) Filed: Apr. 28, 1999

Related U.S. Application Data

(62) Division of application No. 08/512,343, filed on Aug. 8, 1995.

(30) Foreign Application Priority Data

Aug. 16, 1994 (JP) .................................................. 6-214258
Oct. 7, 1994 (JP) .................................................. 6-270564

(51) Int. Cl.$^7$ .................................................. G09G 3/36
(52) U.S. Cl. ........................... 345/100; 345/98; 345/204
(58) Field of Search ........................... 345/100, 98, 211, 345/213, 210

(56) References Cited

U.S. PATENT DOCUMENTS

| | | | |
|---|---|---|---|
| 3,742,142 | * 6/1973 | Martin | 379/106.07 |
| 4,963,860 | 10/1990 | Stewart | 345/206 |
| 5,051,739 | 9/1991 | Hayashida et al. | 345/90 |
| 5,214,417 | * 5/1993 | Yamazaki | 345/210 |
| 5,250,931 | 10/1993 | Misawa et al. | 345/92 |
| 5,323,171 | * 6/1994 | Yokouchi et al. | 345/94 |
| 5,343,221 | * 8/1994 | Arakawa et al. | 345/211 |
| 5,376,944 | * 12/1994 | Mogi et al. | 345/100 |
| 5,418,547 | * 5/1995 | Mizukata et al. | 345/98 |
| 5,555,001 | 9/1996 | Lee et al. | 345/93 |
| 5,563,624 | 10/1996 | Imamura | 345/100 |
| 5,574,475 | 11/1996 | Callahan et al. | 345/100 |
| 5,585,816 | 12/1996 | Scheffer et al. | 345/100 |
| 5,598,180 | 1/1997 | Suzuki et al. | 345/100 |
| 5,644,259 | * 7/1997 | Shishikura et al. | 327/143 |
| 5,703,616 | 12/1997 | Kawasugi | 345/98 |

FOREIGN PATENT DOCUMENTS 05-072992  3/1993  (JP) .

* cited by examiner

Primary Examiner—Bipin Shalwala
Assistant Examiner—Ricardo Osorio
(74) Attorney, Agent, or Firm—Eric J. Robinson; Nixon Peabody LLP

(57) ABSTRACT

In a peripheral driver circuit of a liquid crystal electro-optical device is comprised of a shift register circuit arranged by a plurality of registers, and a circuit for supplying power to each register. When an input signal is entered into an nth register, a supply of power to at least a portion of registers other than the nth register is stopped. The shift register circuit is constructed of a P-channel type TFT and a resistor. The circuit for supplying the power controls the supply of power to the shift register by using the output of the shift register circuit. This circuit for supplying the power is arranged by a P-channel type TFT and a resistor. The consumption power of the circuit for supplying the power is equal to and lower than that of the shift register circuit.

23 Claims, 40 Drawing Sheets

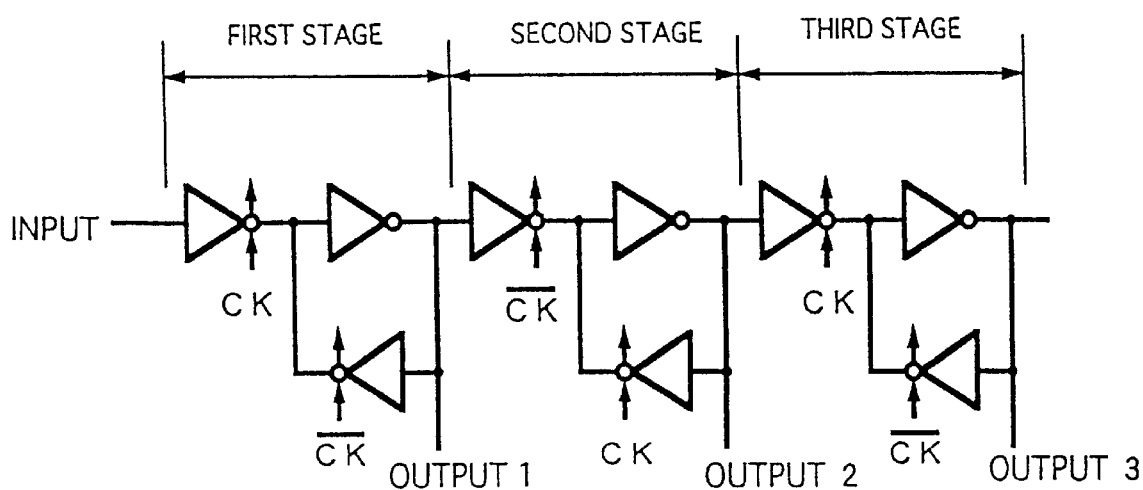
F I G. 2

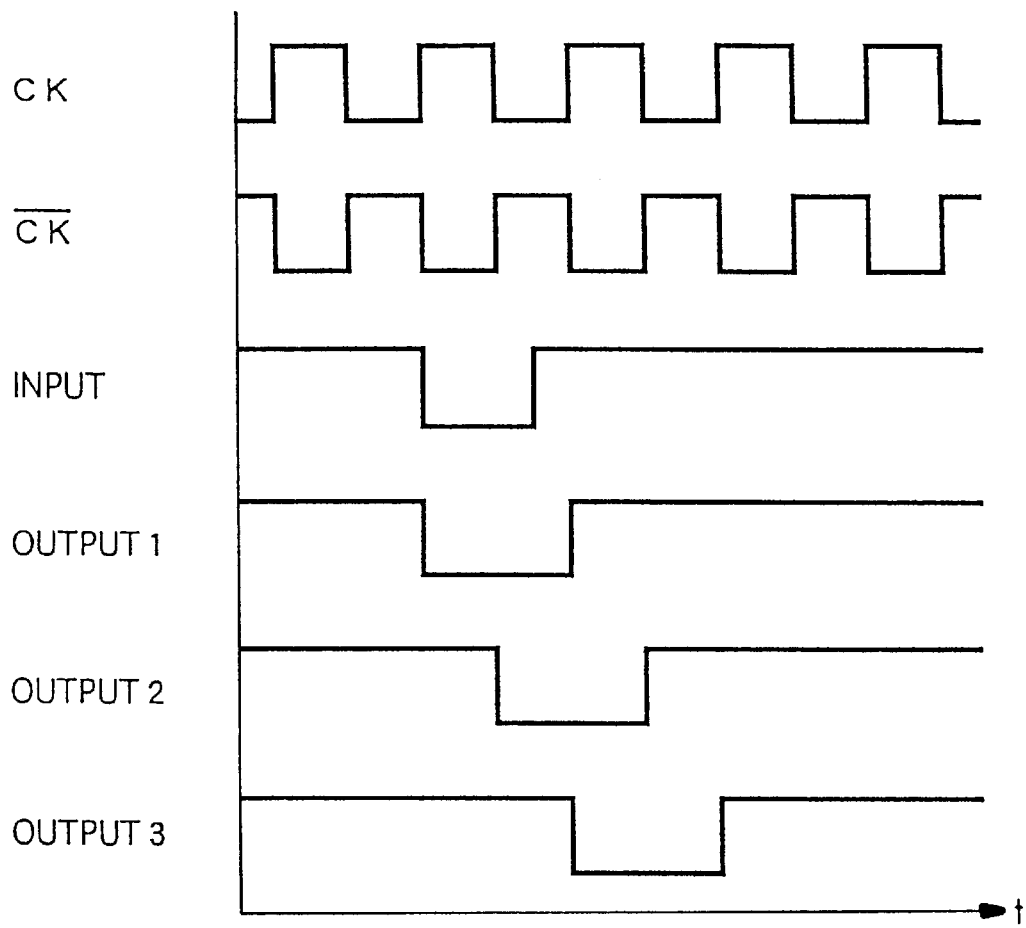
F I G. 3

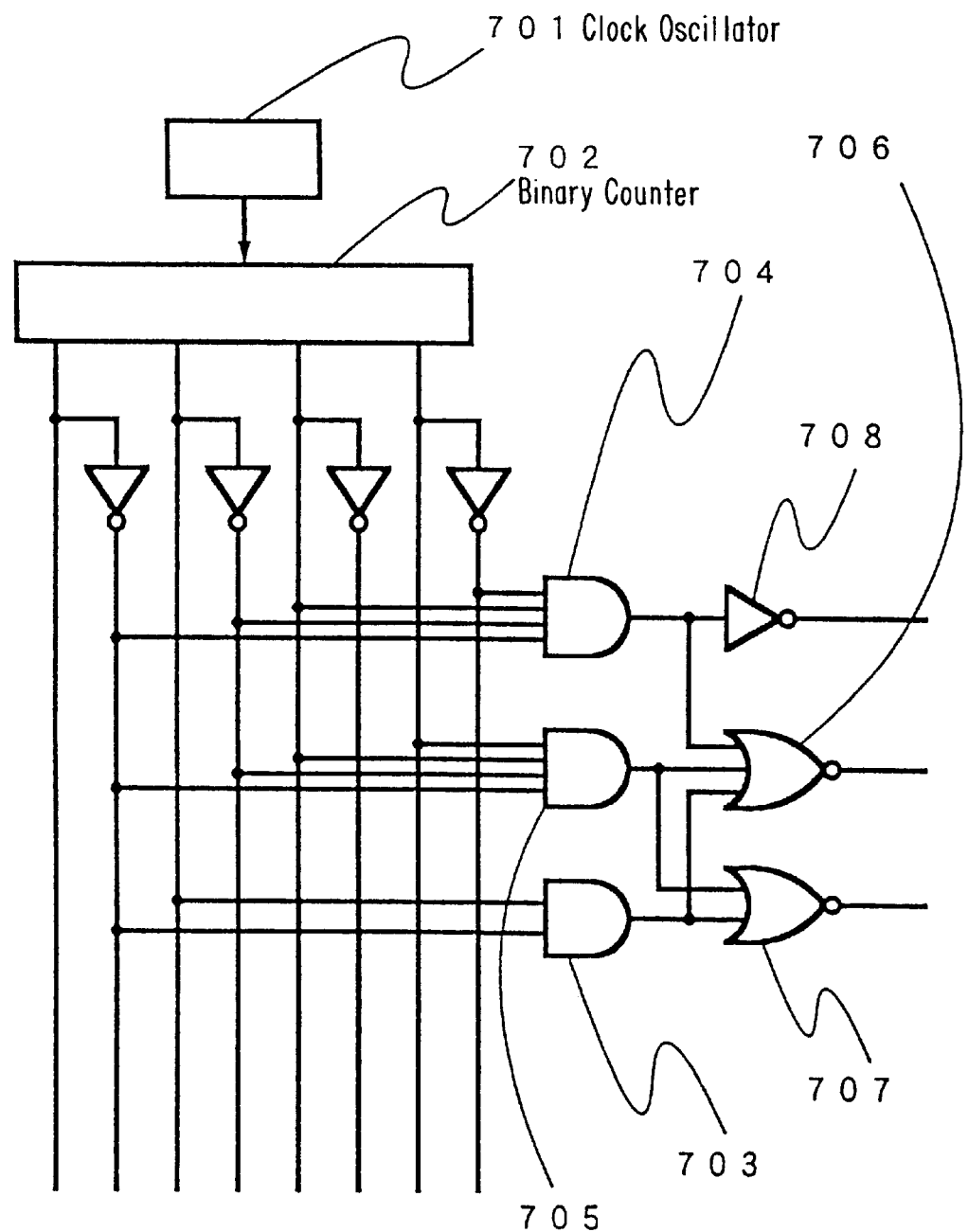
F I G. 7

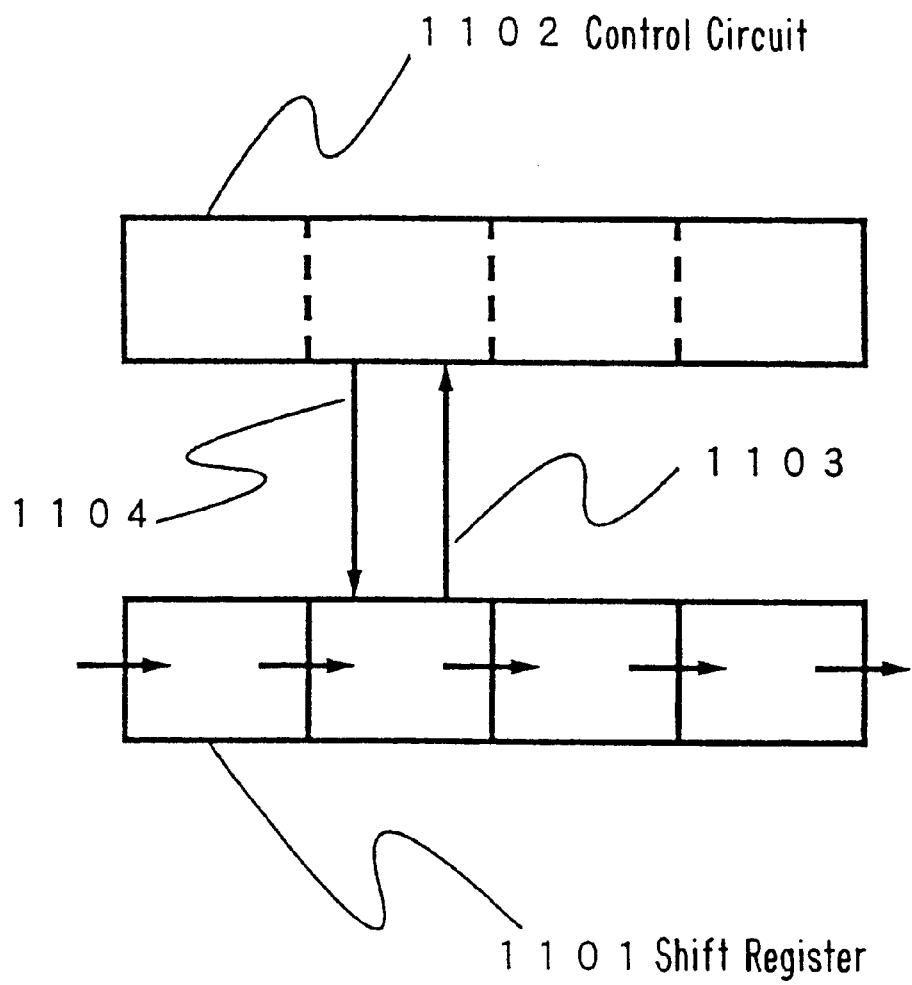
F I G. 1 1

PERIPHERAL DRIVER CIRCUIT OF LIQUID CRYSTAL ELECTRO-OPTICAL DEVICE

This application is a Divisional application of Ser. No. 08/512,343, filed Aug. 8, 1995.

BACKGROUND OF THE INVENTION

1. Field of the Invention

The present invention relates to a peripheral driver circuit of a liquid crystal electro-optical device, more specifically, to a peripheral driver circuit of a liquid crystal electro-optical device operated under low power consumption.

2. Description of the Related Art

The liquid crystal electro-optical device of FIG. 29, is well known in the field, and is constructed of a pixel matrix portion 2901, a signal line driver circuit 2902, and a scanning line driver circuit 2903.

In the pixel matrix portion 2901, a scanning line 2904 and a signal line 2905 are arranged in a matrix form. More specifically, in an active matrix type, a pixel thin film transistor (TFT) 2906 is arranged on a cross point, the gate electrode of the pixel TFT 2906 is connected to the scanning line 2904, the source electrode thereof is connected to the signal line 2905, and the drain electrode thereof is connected to the pixel electrode. In general, since a liquid crystal capacitor 2907 defined between the pixel electrode and the counter electrode cannot obtain a large capacitance value, a retaining capacitor 2908 for retaining electric charges is arranged adjacent to the pixel electrode.

When a voltage exceeding a threshold voltage of a pixel TFT is applied to a scanning line, thereby turning on the pixel TFT, a drain electrode of the pixel TFT and a source electrode thereof are brought into a short-circuit condition. Then, the voltage on the signal line is applied to a pixel electrode so that a liquid crystal capacitor and a retaining capacitor are charged. When the pixel TFT is turned off, the drain electrode is under open state, and then the electric charges stored in the liquid crystal capacitor and the retaining capacitor are held until the pixel TFT is subsequently turned on.

The signal line driver circuit 2902 is constructed of a shift register circuit 2909, a buffer circuit 2910, and a sampling circuit 2911. In the shift register circuit 2909, the input signal synchronized with a video signal is input into a terminal 2912, and is sequentially shifted in response to a clock pulse. The output of the shift register circuit 2909 is input via the inverter type buffer circuit 2910 to the sampling circuit 2911.

The sampling circuit 2911 is constructed of an analog switch 2913 and a retaining capacitor 2914. The analog switch 2913 is turned on/off by the buffer circuit 2910. Under the on state, a video signal line 2915 is short-circuited with the retaining capacitor 2914, so that electric charges are stored in the retaining capacitor 2914. The signal line 2905 is connected to the retaining capacitor 2914 to transfer the sampled video signal to the respective pixels.

The scanning line driver circuit 2903 is arranged by a shift register 2916 and the NAND circuit inverter type buffer 2917, and sequentially drives the scanning lines by inputting therein the input signal synchronized with the vertical sync (synchronization) signal and the clock synchronized with the horizontal sync signal.

As the shift register circuit, there are certain possibility that either a clocked inverter 3001 of FIG. 30A or a transmission gate 3002 of FIG. 30B may be employed.

In FIG. 31, there is shown such a case that the clocked inverter structured shift register of FIG. 30A is realized by a CMOS circuit.

As a peripheral driver circuit of a liquid crystal electro-optical device, when a shift register is constructed by using a CMOS circuit on a transparent substrate on which a pixel matrix is formed, there are the following characteristic drawbacks. That is, since a P-channel type TFT and an N-channel type TFT are manufactured, a total number of manufacturing steps is increased. A characteristic of a P-channel type TFT cannot be easily made coincident with that of an N-channel type TFT. An N-channel type TFT may be readily deteriorated. To the contrary, a shift register circuit with a P-channel type TFT and a register in FIG. 32 does not include the above problems caused by the shift register by using the CMOS circuit.

In the shift register circuit using the P-channel type TFT and the register, as shown in FIG. 32, when a P-channel type TFT 3201 is turned on, a power source 3202 is short-circuited via a register 3204 to a ground 3203, so that a through current may flow and thus power consumption would be increased. When the resistance value of the register 3204 is increased so as not to cause the current flow, the discharge operation cannot be easily performed, and a charge from the power source voltage to the ground voltage is delayed. That is, since the frequency characteristic is deteriorated, it is difficult to increase the resistance value. Such high power consumption would surely cause a serious problem when the liquid crystal electro-optical device is utilized in various electronic devices such as portable information devices.

The conventional liquid crystal electro-optical device of FIG. 33 includes a pixel matrix portion 3301, a signal line driver circuit 3302, and a scanning line driver circuit 3303. In the pixel matrix portion 3301, the scanning line 3304 and the signal line 3305 are arranged in a matrix form. In particular, in an active matrix type, a pixel TFT 3306 is arranged at a cross portion, the gate electrode of a pixel TFT 3306 is connected to the scanning line 3304, the source electrode thereof is connected to the signal line 3305, and the drain electrode thereof is connected to the pixel electrode.

When a voltage exceeding the threshold voltage of the pixel TFT is applied to the scanning line, the pixel TFT is turned on. In this state, the drain electrode of the pixel TFT and the source electrode thereof are brought into the short-circuit state, and the voltage on the signal line is applied to the pixel electrode, so that electric charges are stored into the liquid crystal capacitor. When the pixel TFT is turned off, the drain electrode is under open state, and the electric charges stored in the liquid crystal capacitor are held until the pixel TFT is subsequently turned on.

The liquid crystal capacitor 3307 defined between the pixel electrode and the counter electrode cannot have a large value. As a consequence, the electric charges cannot be held by the liquid crystal capacitor 3307 until the pixel TFT is turned on in the next cycle, so that the voltage applied to the liquid crystal is changed, thereby varying gradation. Therefore, the retaining capacitor 3308 for retaining the electric charges is arranged near the pixel electrode. Accordingly, when the pixel TFT is turned on, both the liquid crystal capacitor and the retaining capacitor are charged.

The signal line driver circuit is constructed of a shift register circuit 3401, a buffer circuit 3402, and a sampling circuit 3403 as shown in FIG. 34. In the shift register circuit, the input signal synchronized with the video signal, is input and is sequentially shifted in response to the clock pulse. The output of the shift register circuit is input via the inverter type buffer circuit to the sampling circuit.

The sampling circuit includes an analog switch 3404 and an retaining capacitor 3405. The analog switch is turned on/off by the buffer circuit to sample the video signal. The sampled signal is held as the electric charges in the retaining capacitor. The signal line is connected to the retaining capacitor, and the sampled video signal is transferred via this signal line to the respective pixels.

As the signal line driver circuit, a decoder circuit may be utilized instead of the shift register circuit. When the respective pixels and the addresses are combined in one-to-one correspondence and then the video signal is written into the pixel, the corresponding address is input into the signal line driver circuit, and one of these signal lines is selected by the decoder circuit. On the selected signal line, the video signal is sampled by the decode signal and then is held as the electric charge in the retaining capacitor.

Further, as the signal line driver circuit, a decoder circuit and a counter circuit may be used. The clock pulse is counted by the counter circuit, and the output of the counter circuit is used as the address signal. In response to the address signal, the signal line is selected by the decoder circuit to write the sampled video signal into the pixel.

FIG. 35 shows a case that the decoder circuit is used in the signal line driver circuit. Address signal inputs 3501 are selected by a NAND gate 3502, and the output of the NAND gate 3502 is used as the input of an analog switch 3503. The video signal is sampled by the analog switch and the sampled video signal is stored as electric charges in the retaining capacitor 3504. Another case where a decoder circuit and a counter circuit are employed in a signal line driver circuit is shown in FIG. 36. The clock pulse input 3601 is counted by a counter circuit 3602. The output of the counter circuit is selected as the address signal by a NAND gate 3603, and the output of the NAND gate 3603 is input into the analog switch 3604. The video signal is sampled by the analog switch and the sampled video signal is held as electric charges into a retaining capacitor 3605.

In FIG. 37, the scanning line driver circuit is constructed of a shift register 3701 and a NAND circuit inverter type buffer 3702. Both the input signal synchronized with the vertical sync signal and the clock synchronized with the horizontal sync signal are input into the scanning line driver circuit to sequentially drive the scanning line. Also, in this scanning line driver circuit, either a decoder circuit, or a combination of a decoder circuit and a counter circuit may be used instead of the shift register.

As a peripheral driver circuit of a liquid crystal electro-optical device, when a shift register is constructed by using a CMOS circuit on a transparent substrate on which a pixel matrix is fabricated, there are the below-mentioned characteristic drawbacks. That is, since a P-channel type TFT and an N-channel type TFT are manufactured, a total number of manufacturing steps is increased. A characteristic of a P-channel type TFT cannot be easily made coincident with that of an N-channel type TFT. To the contrary, a peripheral circuit using either a P-channel type one conductivity mode TFT, or an N-channel type one conductivity mode TFT with a register does not include the above-described problems as explained in the above-explained peripheral circuit by using the CMOS circuit.

There is shown another circuit that a P-channel type TFT and a resister are used. In FIGS. 38A to 38C, there are a NAND circuit (gate), a NOR circuit, and an inverter circuit as a basic circuit, which may constitute a JK-flip-flop of FIG. 39 and further a 4-bit counter circuit of FIG. 40. The counter circuit produces the respective output signal of a ripple carry 4005, counter bit outputs and inverted outputs 4006 in response to the respective input signals of a power supply (power source) 4001, a clear 4002, a clock 4003 and an enable 4004.

In the case that the peripheral driver circuit using the P-channel type TFT and the resister is manufactured on the transparent substrate on which the pixel matrix has been fabricated, in the circuit of FIG. 38, when the P-channel type TFT is turned on, the power source is short-circuited via the resister to the ground, so that a through current may flow and thus power consumption would be increased. When the resistance value of the resister is increased so as not to cause the current flow, the discharge operation cannot be easily performed, and a change from the power source voltage to the ground voltage is delayed. That is, since the frequency characteristic is deteriorated, it is difficult to increase the resistance value. Such high power consumption may surely cause a serious problem when the liquid crystal electro-optical device is used in various electronic devices such as portable information devices.

SUMMARY OF THE INVENTION

An object of the present invention is to provide a peripheral driver circuit of a liquid crystal electro-optical device capable of reducing consumption power when the entire device is driven even when such a shift register circuit with high consumption power of FIG. 32 is used.

Another object of the present invention is to provide an arrangement capable of reducing power required to drive the overall liquid crystal electro-optical device even when such a peripheral driver circuit of FIG. 38 is used, namely the peripheral driver circuit arranged by a thin film transistor (TFT) and a resistor.

To solve the above problems, according to one aspect of the present invention, a peripheral driver circuit of a liquid crystal electro-optical device is comprised of a shift register circuit arranged by a plurality of registers, and a circuit for supplying power to each register or each portion. When an input signal is entered into an nth register, a supply of power to at least a portion of registers other than the nth register is stopped. The shift register circuit of the present invention is constructed of a P-channel type TFT and a resistor. The circuit for supplying the power controls the supply of power to the shift register by using the output of the shift register circuit. This circuit for supplying the power is arranged by a P-channel type TFT and a resistor. The consumption power of the circuit for supplying the power is equal to and lower than that of the shift register circuit.

According to another aspect of the present invention, a peripheral driver circuit of a liquid crystal electro-optical device is comprised of a shift register circuit arranged by a plurality of registers, and a circuit for supplying power to each register or each portion. When an input signal is entered into an nth staged register, a supply of power to the registers before an (n−2)th register and after an (n+2)th register is stopped. The shift register circuit of the present invention is constructed of a P-channel type TFT and a resistor. The circuit for supplying the power controls the supply of power to the shift register by using the output of the shift register circuit. This circuit for supplying the power is arranged by a P-channel type TFT and a resistor. The consumption power of the circuit for supplying the power is equal to and lower than that of the shift register circuit.

According to another aspect of the present invention, a peripheral driver circuit of a liquid crystal electro-optical device is comprised of a shift register circuit arranged by a plurality of registers, and a circuit for supplying power to each register or each portion. When an input signal is entered into an nth register, a supply of power to the registers before an (n−x)th register and after an (n+y)th register is stopped (x≧2, and y≧2). The shift register circuit of the present invention is constructed of a P-channel type TFT and a resistor. The circuit for supplying the power controls the supply of power to the shift register by using the output of the shift register circuit. This circuit for supplying the power is arranged by a P-channel type TFT and a resistor. The consumption power of the circuit for supplying the power is equal to and lower than that of the shift register circuit.

According to another aspect of the present invention, a peripheral driver circuit of a liquid crystal electro-optical device is comprised of a shift register circuit arranged by a plurality of registers, and a circuit for supplying power to each register or each portion. In this peripheral driver circuit, the shift register circuit is subdivided into a plurality of blocks, each of these plural blocks is arranged by more than one register, whereas the power supply circuit is independently connected to each of these plural blocks. When an input signal is entered into a register for constituting one of plural blocks, the supply of power to any blocks other than this block is stopped. The shift register circuit of the present invention is constructed of a P-channel type TFT and a resistor. The circuit for supplying the power is operated at consumption power equal to and lower than that of the shift register.

To lower the consumption power of the overall peripheral driver circuit, operation of a shift register employed in the peripheral driver circuit will now be considered. A function required for a shift register in the peripheral driver circuit of the liquid crystal electro-optical device is to transfer one signal in synchronism with a clock. That is, only a portion of the peripheral driver circuit functions as a shift register.

Accordingly, in FIG. 1, when an input signal is entered into an nth register 103 of a shift register 102 with respect to a liquid crystal display portion 101, a supply of power to the registers before the (n−1)th register which have transferred the signal may be stopped or interrupted, while maintaining such an output giving no adverse influence to the final stage of a buffer 104 and a sampler 105. Further, the supply of power to the registers after a (n+1)th register 107, before the input signal is transferred, may be stopped. Similarly, in a shift register 108, when the input signal is entered into the nth register 110, the supply of power to the register 111 before the (n−1)th register, and also to the register 112 after the (n+1)th register may be stopped, while maintaining an output giving no advance influence to a buffer 109.

As described above, although high consumption power is required when the overall circuit is operated, overall consumption power may be suppressed by operating only the necessary circuit portion, even if the respective consumption power thereof is not changed.

In FIG. 12A, there is shown the peripheral driver circuit of the liquid crystal electro-optical device comprising a shift register circuit arranged by a plurality of registers, and a circuit for supplying power to each register or each portion. When an input signal is entered into an nth register, a supply of power to the registers before an (n−2)th register and after an (n+2)th register is stopped.

In the shift register for the peripheral driver circuit of the liquid crystal electro-optical device, when the two adjacent registers simultaneously produce an active output, the (n−1)th register also produces the active output at a time when the input signal has reached the nth register, so that the supply of power to the registers before the (n−2)th resister may be stopped.

When a pulse width is surely defined by one time period of the clock, the supply of power to the (n+1)th register which needs not produce the active output when the input signal reaches the nth register is started, and then the input signal is surely transferred at the next clock change. As a consequence, when the input signal reaches the nth register, the supply of power to the registers after the (n+2)th register may be stopped. When it is allowable in any changes of the pulse width of the input signal caused by the element delay, the supply of power to the registers after (n+1)th register may be stopped.

In FIG. 18A, when a total element number is desirably reduced rather than a reduction of consumption power, stopping of the power supply is not limited to the above case, i.e., the power supply to the registers before the (n−2)th register and after the (n+2)th register is stopped. That is, when the input signal reaches the nth register, the supply of power to the (n−x)th registers (x≧2) may be stopped because the power supplying operation to the (n−2)th register is continued, and no power supplying operation to the (n−3)th nor (n−4)th registers is carried out.

When the input signal reaches the nth register, the power supplying operation to the (n+y)th register (y≧2) may be stopped, because the power is supplied to the (n+2)th register and no power supplying operation to the (n+3)th and (n+4)th registers is carried out.

In FIG. 4, there is shown the peripheral driver circuit of the liquid crystal electro-optical device comprising a shift register circuit arranged by a plurality of registers, and a circuit for supplying power to each register or each portion. The shift register circuit has a plurality of blocks. Each block is constructed by at least two register. The power supply circuits are connected with each block independently. When an input signal is entered to a register included in one of the blocks, the power supply to blocks other than the one block is stopped.

The power supply circuit is shown in FIG. 8. It is possible that the control circuit is provided with each of these registers, to control a single register. When the control circuit becomes complex, it is preferable that several registers are combined with each other to construct one block for control. In this state, the power supply voltage is applied to two blocks during such a time period when the input signal is transmitted/received between these blocks. The power supply voltage is applied to one block for receiving the input signal, whereas the supply of power to the other block for receiving no input signal may be stopped.

Further, a peripheral driver circuit of a liquid crystal electro-optical device is arranged by one conductivity type TFT and a capacitor. Alternatively, a peripheral driver circuit of a liquid crystal electro-optical device includes a circuit for controlling a power supply operation, which is constructed of one conductivity type TFT, a resistor and a capacitor.

According to one aspect of the present invention in the peripheral driver circuit of the liquid crystal electro-optical device, when the power is supplied to the circuit portion required to specify the pixel, the power supply operation to at least a portion of the above circuit portion is interrupted.

According to another aspect of the present invention in the peripheral driver circuit of the liquid crystal electro-optical device, when the power is supplied to the circuit portion required to specify the pixel, the power supply voltage applied to at least a portion of the above circuit portion is lowered.

Also, according to another aspect of the present invention, in the scanning line driver circuit of the peripheral driver circuit of the liquid crystal electro-optical device, when either the voltage is applied to the nth pixel, or the sampling signal is sampled by the nth sampling circuit in the signal line driver circuit, the power supply voltage is lowered which is applied to the portions corresponding to the pixels after the (n+1)th pixel, and the portions corresponding to the pixels before the (n−2)th pixel.

In the peripheral driver circuit of the liquid crystal electro-optical device according to another aspect of the present invention, when either the voltage is applied to the nth pixel, or the sampled video signal is written into the nth pixel, the power supply voltage is reduced which is applied to the portion corresponding to (n+x)th pixel (x≧1) and the portion corresponding to (n−y)th pixel (y≧2) in the peripheral driver circuit.

In the peripheral driver circuit of the liquid crystal electro-optical device according to another aspect of the present invention, when a plurality of pixels having the matrix arrangement are subdivided into a plurality of blocks, and there is neither such a pixel to which the voltage is applied, nor such a pixel into which the sampled video signal is written, the power supply operation to at least a portion corresponding to the pixel in the block is stopped.

In the peripheral driver circuit of the liquid crystal electro-optical device according to another aspect of the present invention, when a plurality of pixels having the matrix structure are subdivided into a plurality of blocks and there is either a pixel to which the voltage is applied in the nth block among the plural blocks, or a pixel into which the sampled video signal is written, the power supply operation to the peripheral driver circuit corresponding to the pixel of at least a portion of the blocks after the (N+1)th block and before the (n−1)th block is stopped.

In the peripheral driver circuit of the liquid crystal electro-optical device according to another aspect of the present invention, when a plurality of pixels having the matrix structure are subdivided into a plurality of blocks and there is either a pixel to which the voltage is applied in the nth block among the plural blocks, or a pixel into which the sampled video signal is written, the power supply operation to the peripheral driver circuit corresponding to the pixel of at least a portion of the (n+x)th block and the (n−y)th block (x≧1 and y≧1).

In the peripheral driver circuit of the liquid crystal electro-optical device according to another aspect of the present invention, when a plurality of pixels having the matrix arrangement are subdivided into a plurality of blocks, and there is neither such a pixel to which the voltage is applied, nor such a pixel into which the sampled video signal is written,-the power supply operation to at least a portion corresponding to the pixel in the block is lowered.

In the peripheral driver circuit of the liquid crystal electro-optical device according to another aspect of the present invention, when a plurality of pixels having the matrix structure are subdivided into a plurality of blocks and there is either a pixel to which the voltage is applied in the nth block among the plural blocks, or a pixel into which the sampled video signal is written, the power supply operation to the peripheral driver circuit corresponding to the pixel of at least a portion of the blocks after the (n+1)th block and before the (n−1)th block is lowered.

In the peripheral driver circuit of the liquid crystal electro-optical device according to another aspect of the present invention, when a plurality of pixels having the matrix structure are subdivided into a plurality of blocks and there is either a pixel to which the voltage is applied in the nth block among the plural blocks, or a pixel into which the sampled video signal is written, the power supply operation to the peripheral driver circuit corresponding to the pixel of at least a portion of the blocks after the (n+1)th block and before the (n−1)th block is lowered.

To reduce consumption power in the peripheral driver circuit of the liquid crystal electro-optical device, the peripheral driver circuit will now be considered. A voltage difference about 5 V is required to drive a liquid crystal in view of a transmittance-to-voltage characteristic. While a DC voltage is applied to a liquid crystal, the liquid crystal would be deteriorated. As a consequence, when the liquid crystal is driven by an AC voltage, a voltage difference requires approximately 10 V, so that the power supply voltage of the peripheral driver circuit requires 20 V or more.

In the point sequential scanning operation, since a video signal is written into a certain pixel, the peripheral driver circuit samples the video signal to turn on a pixel TFT. That is, the overall peripheral driver circuit is operated so as to specify one pixel. It should be noted in the following specification that both of the below-mentioned operations will be referred as "a pixel being specified". That is, a video signal is sampled with respect to a pixel by the signal line driver circuit to charge a retaining capacitor, and/or a pixel TFT connected to a scanning line is brought into an on state by the scanning line driver circuit.

As a consequence, even when the power is supplied to the entire peripheral driver circuit, only a portion thereof is operable. Therefore, as to the non-functional (not operated) circuit portion, namely the portion not for specifying the pixel of the peripheral driver circuit, the power supply voltage may be reduced, or the power supply may be stopped so as to prevent erroneous operation thereof.

In the portion not for specifying the pixel in the peripheral driver circuit, the power supply voltage is lowered at or below 20 V to reduce consumption power. Thus, minimum consumption power is realized. Normally, while the peripheral driver circuit is operated under voltages equal to or lower than 20 V, the power supply voltage is set to 20 V only when the pixel is specified, resulting in low consumption power.

As described above, when the overall circuit is operated, high power is consumed. However, since the high power supply voltage is applied only to the required portion, the overall consumption power can be suppressed even when the respective consumption powers do not change.

Concretely speaking, in the circuit of FIG. 34, it is assumed that a circuit for firstly specifying a pixel in response to an input signal is a first circuit, and a circuit for finally specifying a pixel is an m-th circuit. When the input signal reaches an nth circuit, an output of the nth circuit becomes active. In the circuit of FIG. 34, an output of an (n−1)th circuit also becomes active. As a result, since outputs of other circuits become not active, the power supply voltage can be reduced. That is, the power supply voltage to the (n−2)th, (n−3)th, . . . circuit portions may be reduced. Also, the power supply voltage to the (n+1)th, (n+2)th, . . . , circuit portions may be lowered. It should be noted that while the power supply voltage to the (n−2)th circuit portion remains, the power supply voltage to the (n−3)th, (n−4)th, . . . circuit portions may be reduced. Also, while the power supply voltage to the (n+1)th circuit portion is not charged, the power supply voltage to the (n+2)th, (n+3)th, . . . circuit portions may be reduced.

Further, several pixels are combined with each other to constitute one block, and the power supply may be controlled for the respective blocks. A block for firstly specifying a pixel is referred to a first block, and the subsequent blocks are sequentially numbered. When the circuit for specifying the pixel is present in the nth block, the power supply operation to the (n+1)th, (n+2)th, . . . , blocks may be stopped, or the power supply voltage thereof may be reduced. Alternatively, while the power supply of the (n+1) th block is not changed, the power supply operation to the (n+2)th, (n+3)th, . . . , blocks may be stopped, or the power supply voltage thereof may be lowered. Alternatively, while the power supply of the (n−1)th block is not charged, the power supply operation to the (n−2)th, (n−3)th, . . . , blocks may be stopped, or the power supply voltage thereof may be lowered.

BRIEF DESCRIPTION OF THE DRAWINGS

FIG. 2 schematically shows a shift register arranged by a clocked inverter in the peripheral driver circuit;

FIG. 3 is a timing chart for showing operations of the shift register of FIG. 2;

FIG. 7 is a decoder portion of the embodiment 1;

FIG. 11 schematically shows a circuit arrangement according to an embodiment 2;

DETAILED DESCRIPTION OF THE PREFERRED EMBODIMENT

In embodiments 1 to 4 of the present invention, shift registers with a circuit of FIG. 2 are used in which output signals from the respective registers are represented in a timing chart of FIG. 3.

EMBODIMENT 1

Figure 4:
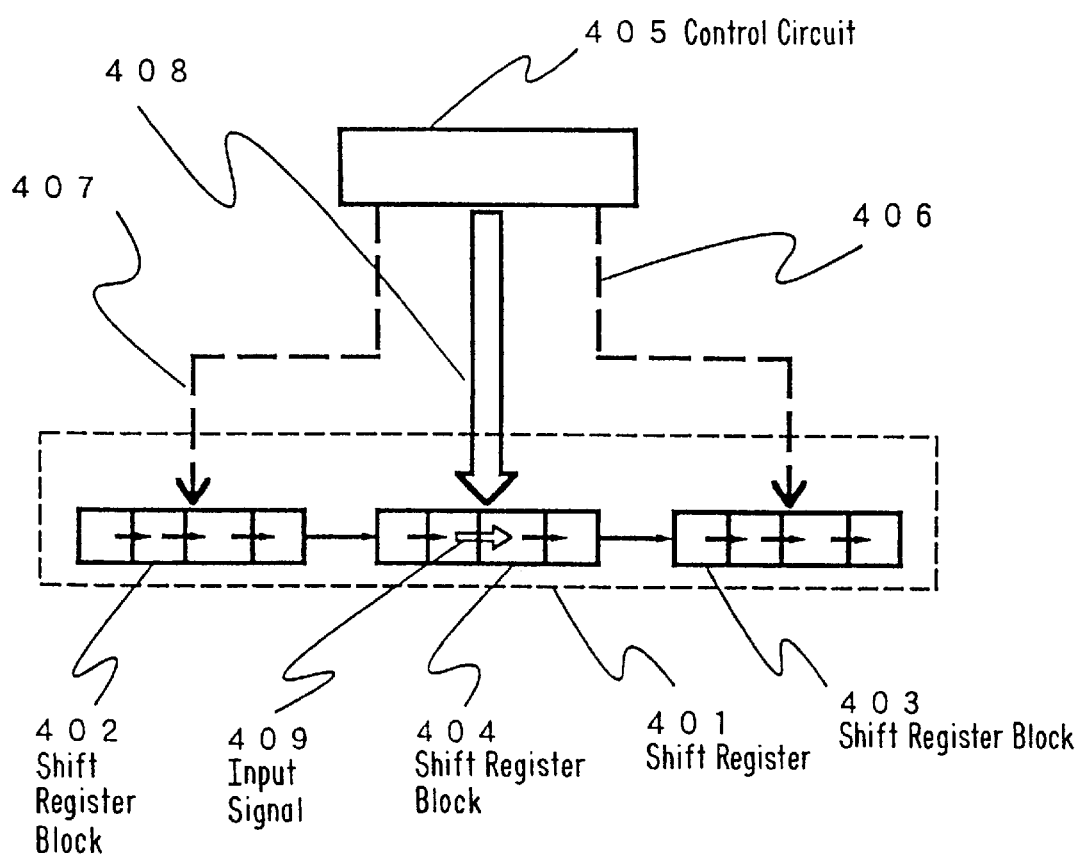
FIG. 4 schematically indicates a circuit arrangement according to an embodiment 1.

In the embodiment 1, a shift register is formed as blocks, and power is supplied to the respective blocks. In FIG. 4, several registers of a shift register 401 are employed to form blocks 402, 403 and 404. From a control circuit 405, control signals 406, 407 and 408 are supplied to the respective blocks. The block 402 and the like will be referred to as a "shift register block" hereinafter. When an input signal 409 to be shifted is present in a shift register block 404, a control signal 408 used to supply power is input into the shift register block 404. Signals 406 and 407 used to stop (interrupt) a supply of power to the blocks are input to both of the shift register block 402 after the shifting input signal has been transferred, and the shift register block 403 before the shifting input signal is transferred in order to stop the supply of power, so that consumption power is reduced.

Figure 5:
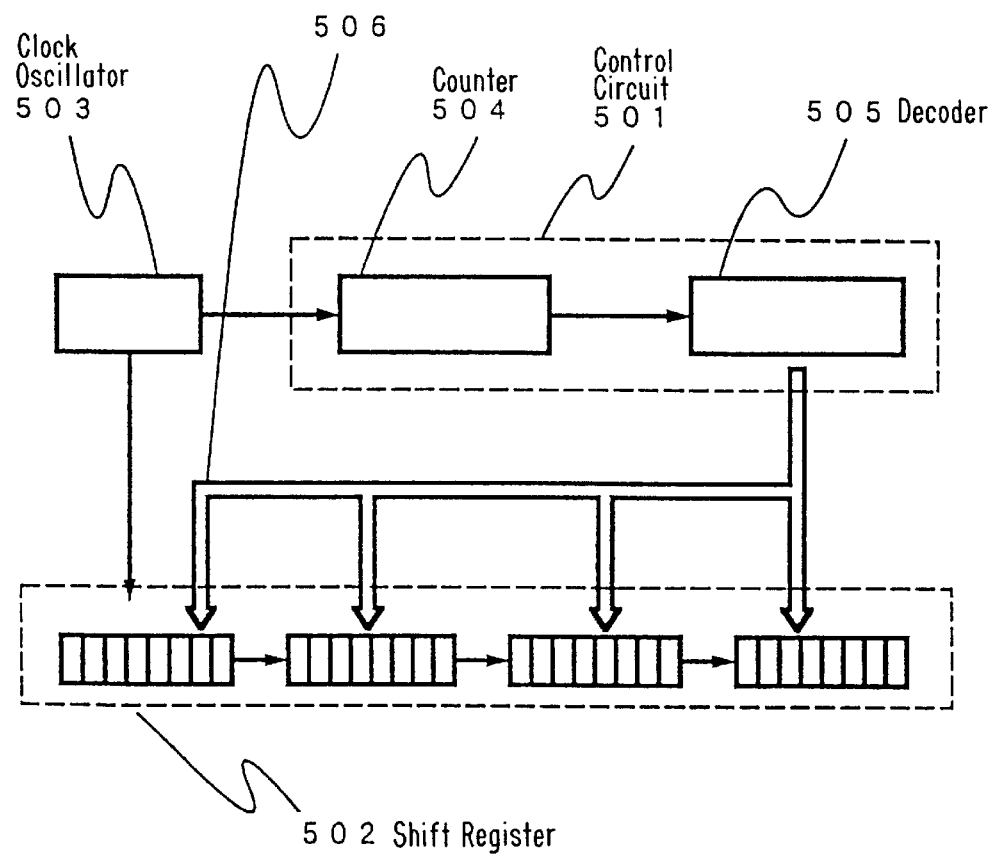
FIG. 5 schematically illustrates a block diagram of the embodiment 1.

In FIG. 5, there is shown such a case that eight registers are used to construct a single block. Although it is possible to detect an input signal to produce a control signal, the synchronization established between a control circuit 501 and a shift register 502 is utilized to produce such a control signal in this circuit.

A signal from a clock oscillator 503 is input into the shift register 502 and the counter 504 of the control circuit 501. An output of the counter 504 becomes a control signal 506 through a decoder 505. The control signal 506 is input to the shift register 502. In the embodiment 1, the control circuit is constructed of a CMOS circuit outside a transparent substrate on which a pixel matrix portion has been formed.

Figure 6:
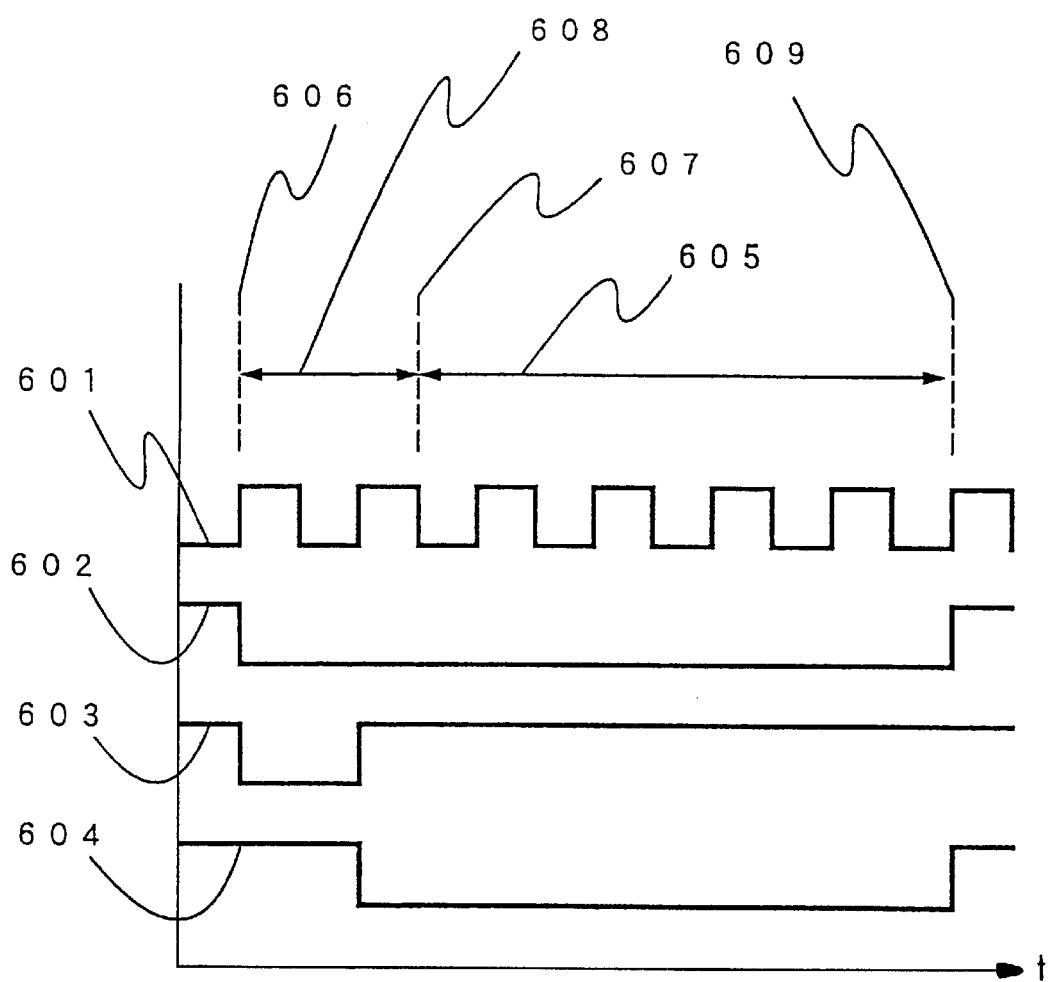
FIG. 6 is a timing chart of the embodiment 1.

FIG. 6 is a timing chart of the control signal 506 with respect to an nth block.

Based on a clock signal 601 of the clock oscillator 503 of FIG. 5, a power supply signal 602, a clear signal 603 for initialization when the nth shift register block is activated (started), and a clock supply signal 604 are produced as three signals, to use the control signal 506.

When eight registers are used to constitute one block, power is supplied at a time 606 other than a time period 605 required to produce an output, and a clock signal is started to be supplied at a time 607. Both the time 606 and the time 607 are not provided at the same time, but a time period 608 is provided, so that the outputs are surely produced at the activation. After the input signal in the nth block has been transferred to the (n+1)th block, the supply of power to the nth block may be stopped, or interrupted at any time. In this circuit, both the power supply operation and the clock supply operation are stopped at a time 609.

In FIG. 7, there is shown a circuit for producing the control signal 506 which is supplied to the fourth block when eight registers are employed to constitute a single block. An output of a clock oscillator 701 identical to the clock oscillator 503 of FIG. 5 is input to a binary counter 702. An output of the binary counter 702 is detected by AND gate circuits 703, 704, 705, and the detected signal is synthesized by OR gate circuits 706, 707 to produce the control signal.

The AND circuit 703 selects a time period required by that the shift register block transfers the input signal in the internal of the block. The AND circuit 704 selects a clear period. The AND circuit 705 selects the clear period and a time period used to transfer the input signal. As a consequence, when the outputs of the AND circuits 703, 704, and 705 are OR-logic-operated by the OR circuit 706, a power supply signal 602 is produced. Also, an output of the AND circuit 704 is inverted by an inverter 708 to obtain a clear signal 603. Outputs of the AND circuits 703 and 705 are processed by the OR circuit 708 to obtain a clock supply signal 604.

Figure 8:
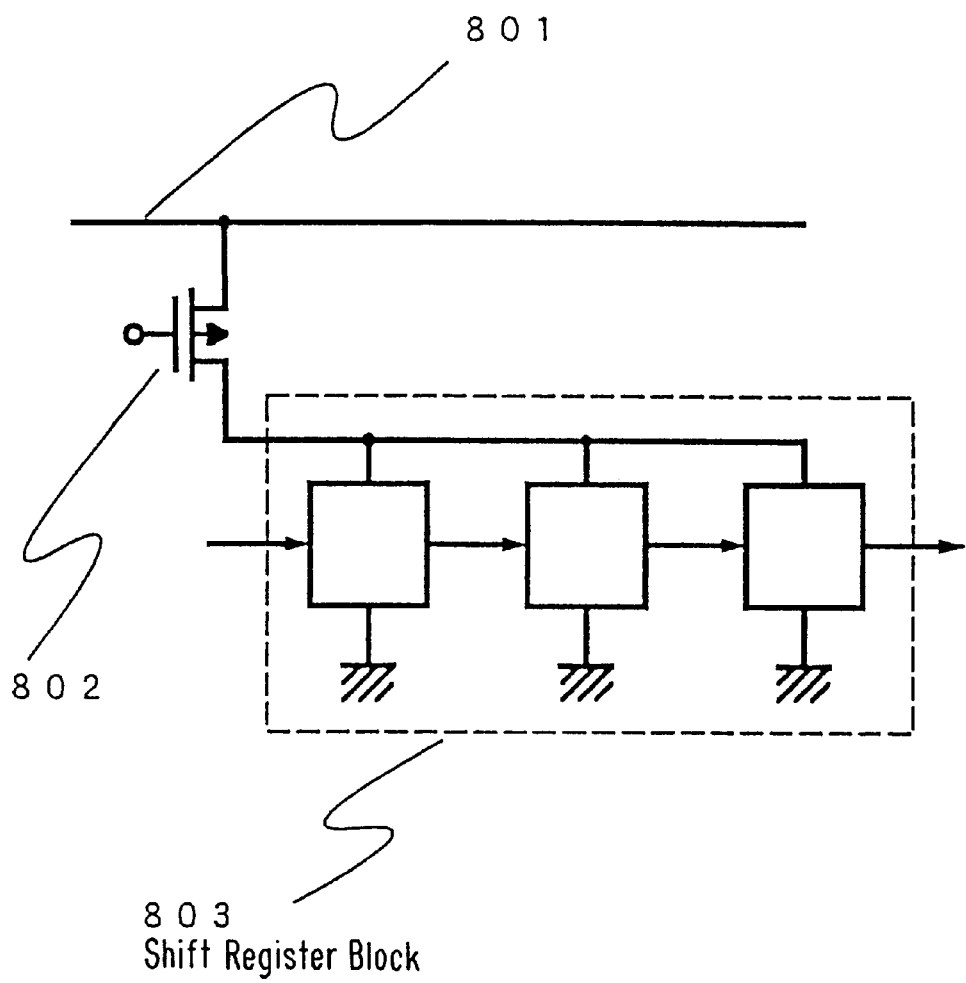
FIG. 8 is a power supply circuit of the embodiment 1.

In FIG. 8, there is shown a circuit for supplying power to a shift register block by a P-channel type thin film transistor (TFT). A power supply (power source) line 801 at a plus side is connected via a P-channel type TFT 802 to a shift register block 803. The power supply signal 602 is applied to a gate electrode of the P-channel type TFT 802.

Figure 9:
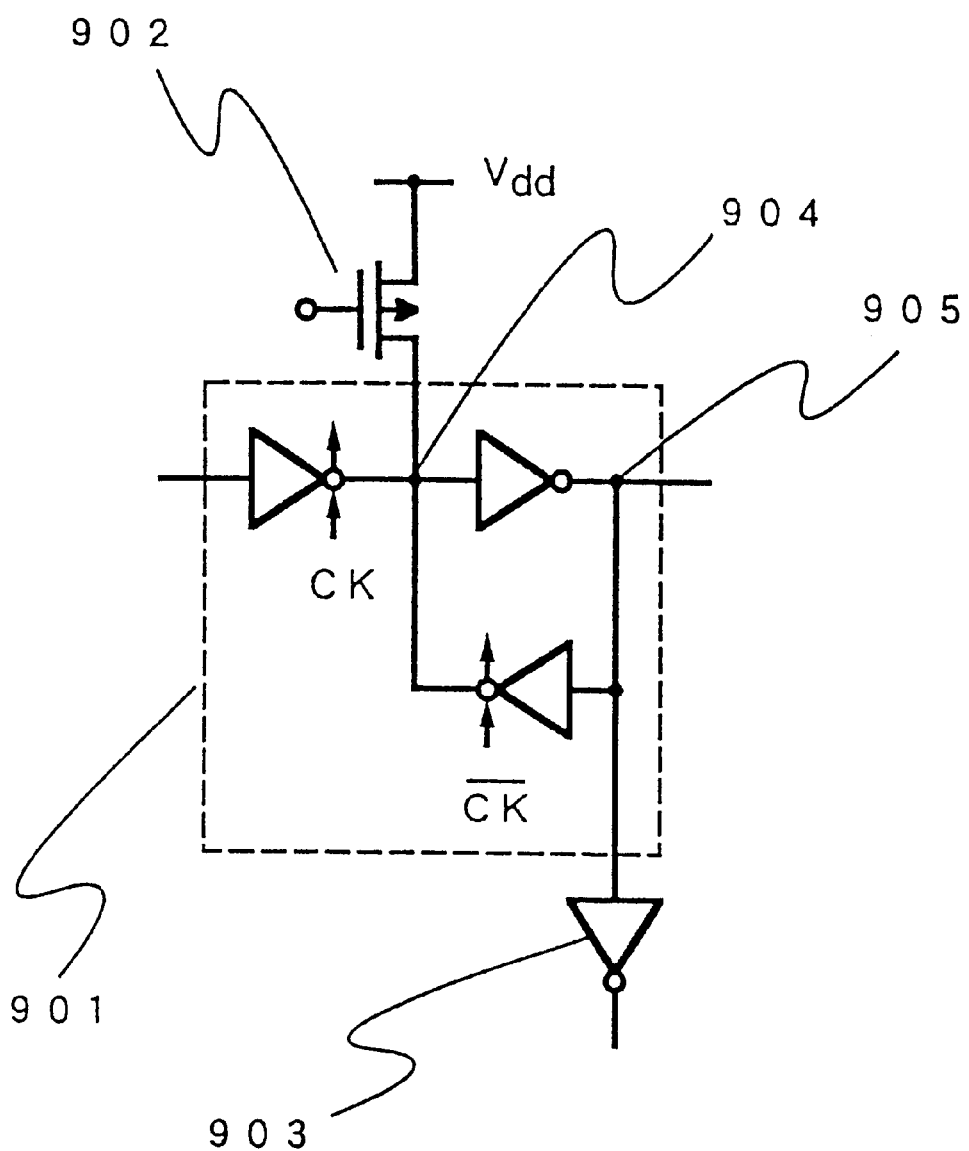
FIG. 9 is a clear circuit of the embodiment 1.

FIG. 9 is a clear circuit. A P-channel type TFT 902 which may define a value of a storage loop of a first register (stage) 901 of the shift register is connected at activation. A clear signal 603 is applied to a gate electrode of the P-channel type TFT 902. To define the value of the loop in order that the output of the buffer 903 is not changed before and after the register is activated, the drain electrode of the P-channel type TFT 902 is connected to a contact point 904 when the output of the buffer 903 is normally at the voltage of the power supply, and is connected to a contact point 905 when the output of the buffer 903 is normally at the ground voltage.

Figure 10:
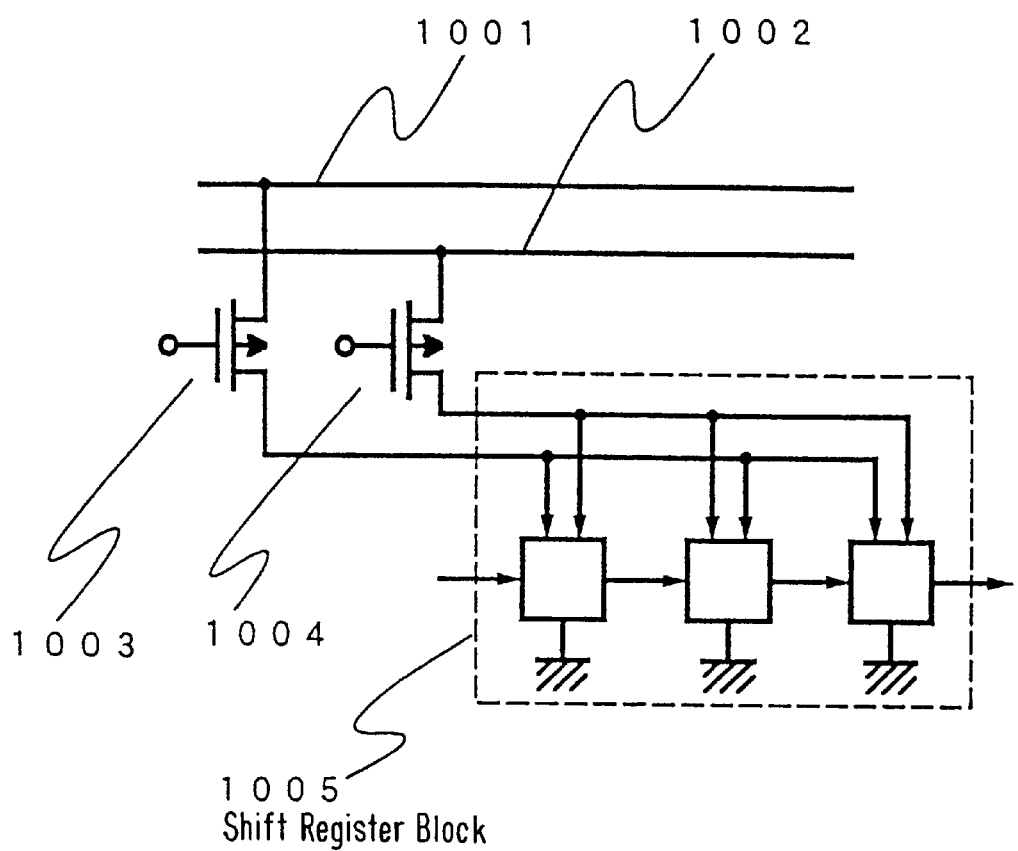
FIG. 10 is a clock supply circuit of the embodiment 1.

FIG. 10 is a clock supply circuit. Clock lines 1001 and 1002 are connected via P-channel type TFTs 1003 and 1004 to a shift register block 1005. A clock supply signal 604 is applied to gate electrodes of P-channel type TFTs 1003 and 1004.

As to the shift register of this embodiment, a comparison will be made of consumption power when this shift register is utilized as the peripheral driver circuit of the liquid crystal electro-optical device. It should be noted that consumed power at a signal resister is defined by dividing a squared value of power supply voltage for each resister by a resistance value.

Figure 32:
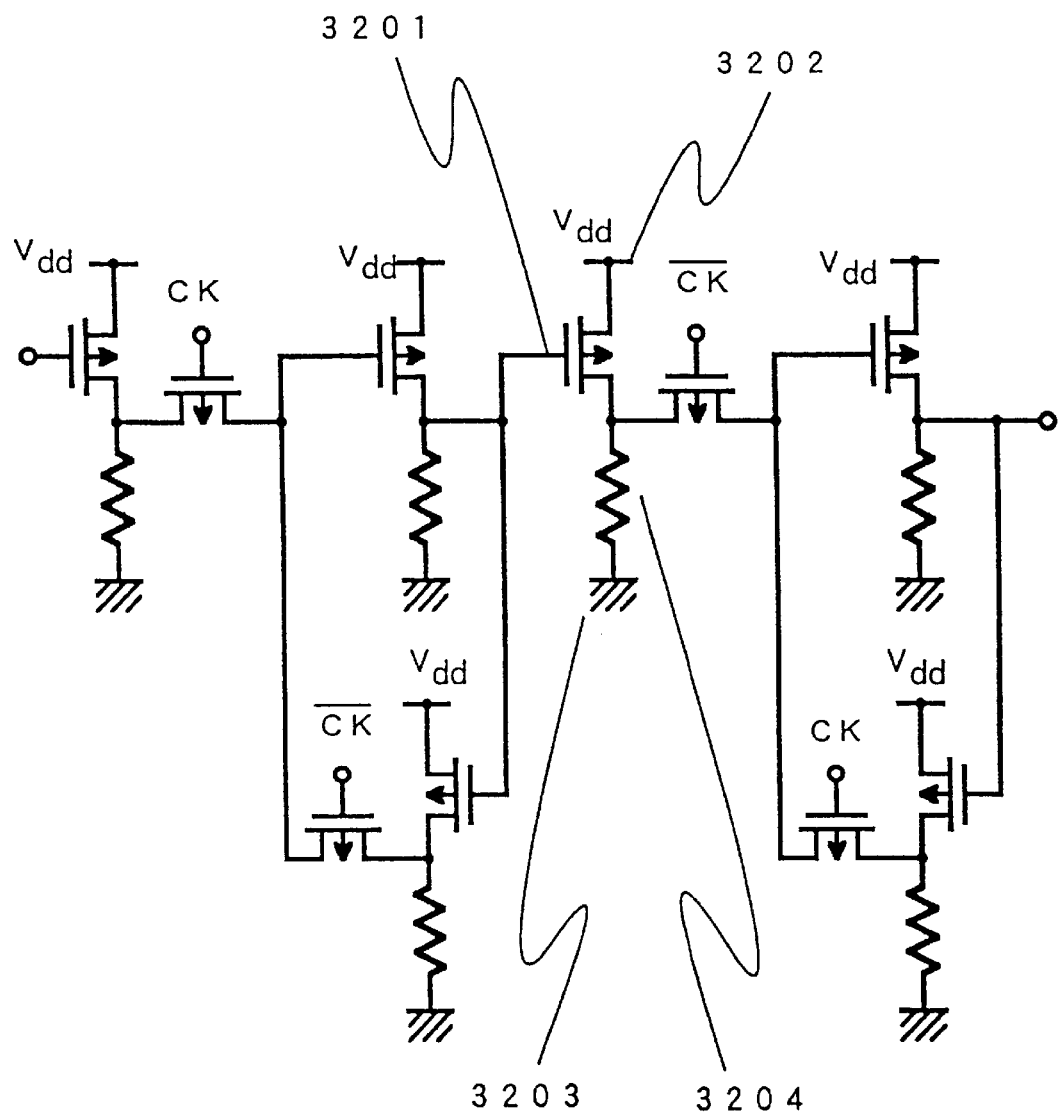
FIG. 32 schematically indicates the shift register constructed of the P-channel type TFT and the register.
Figure 33:
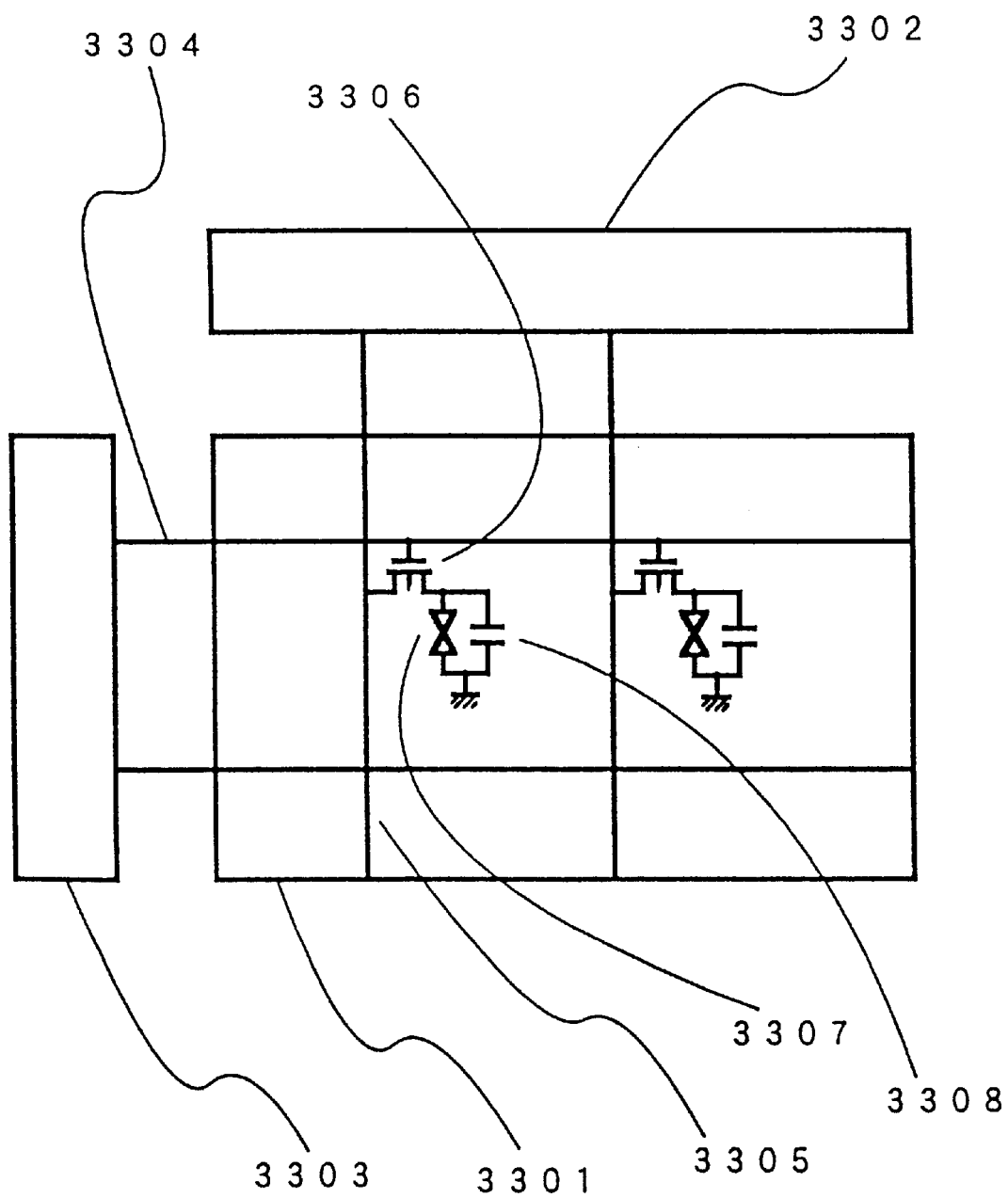
FIG. 33 schematically shows the conventional peripheral driver circuit and pixel matrix portion.
Figure 34:
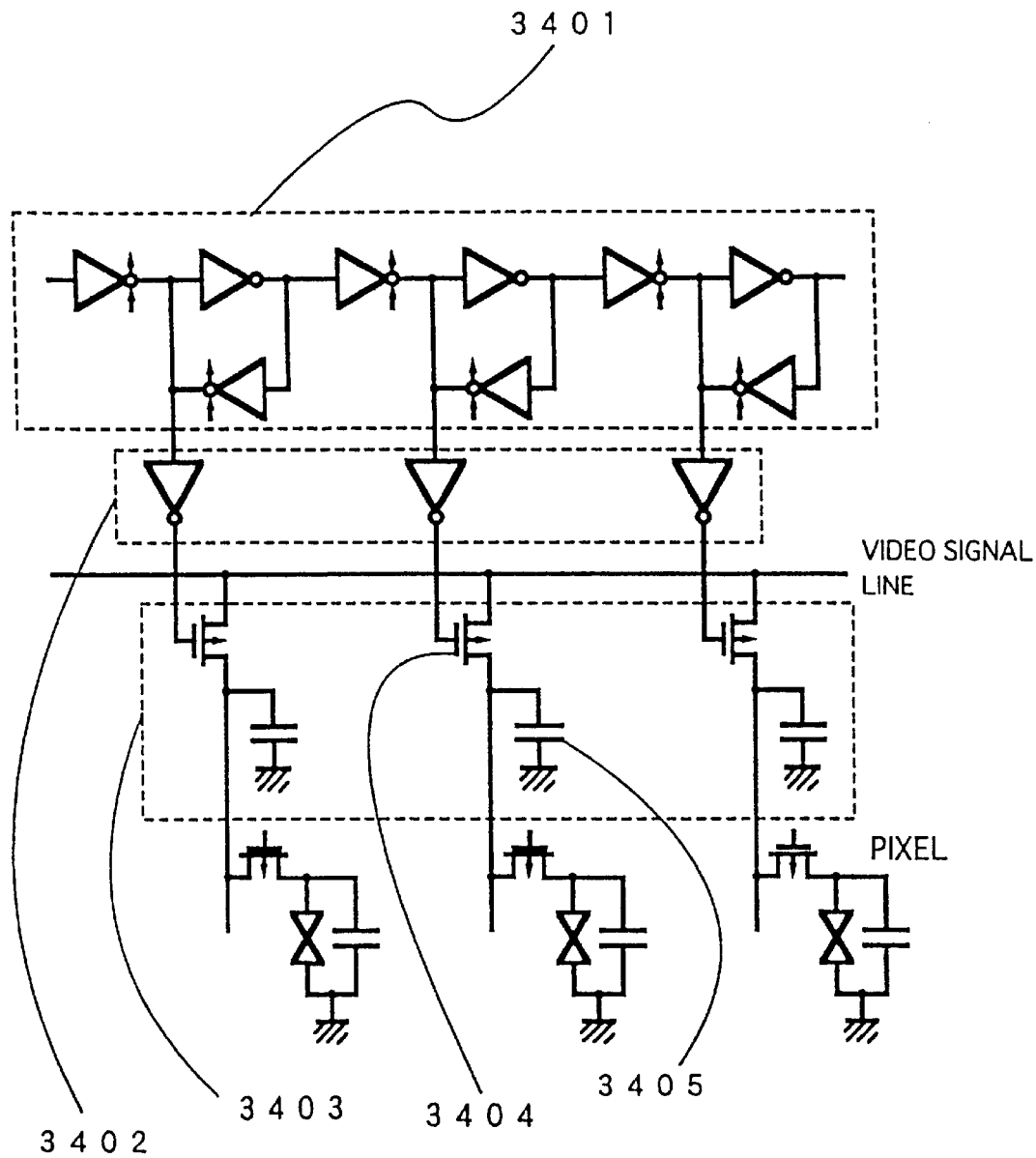
FIG. 34 schematically shows the signal line driver circuit using the shift register.
Figure 35:
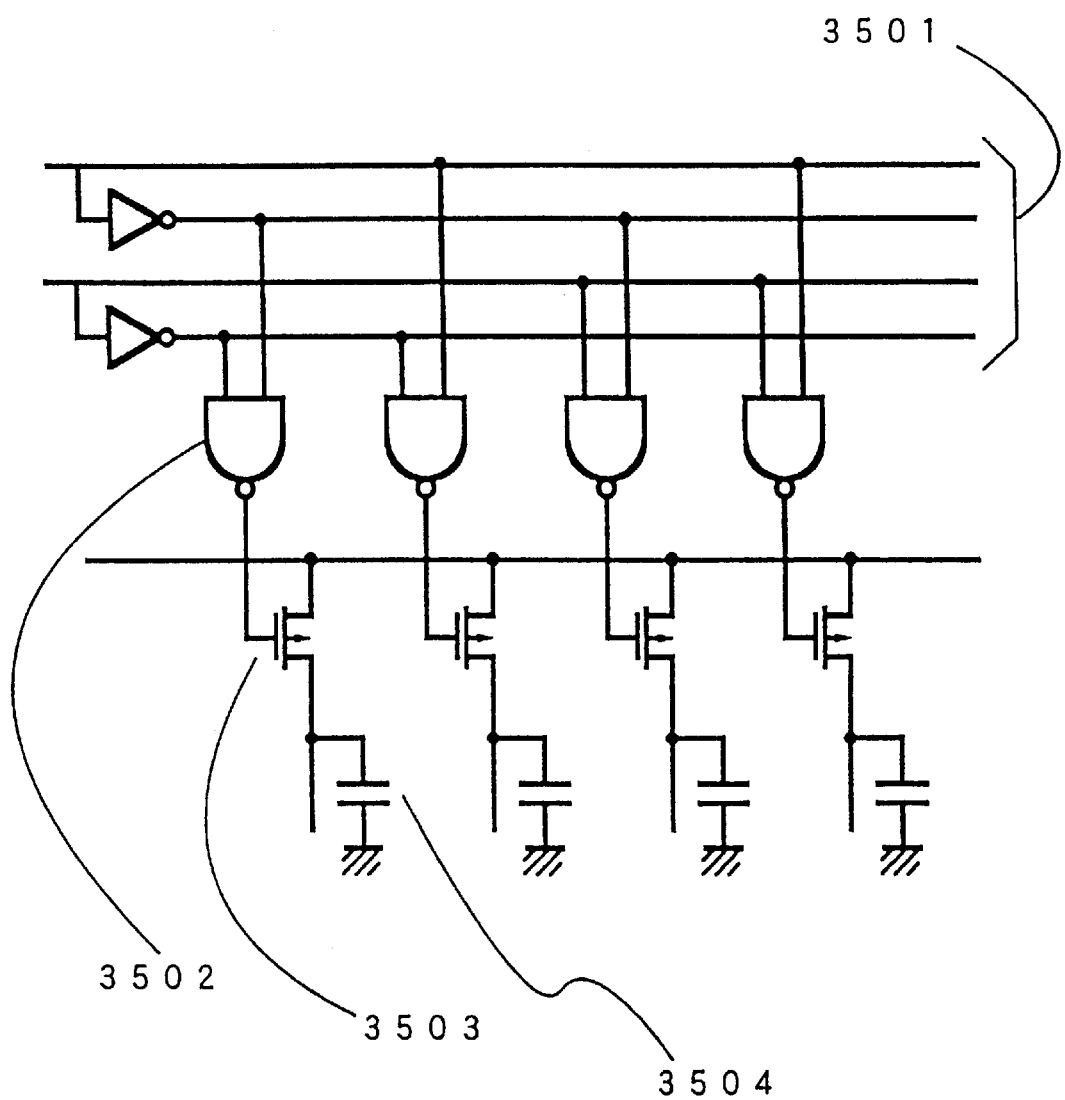
FIG. 35 schematically indicates the signal line driver circuit using the address decoder.
Figure 36:
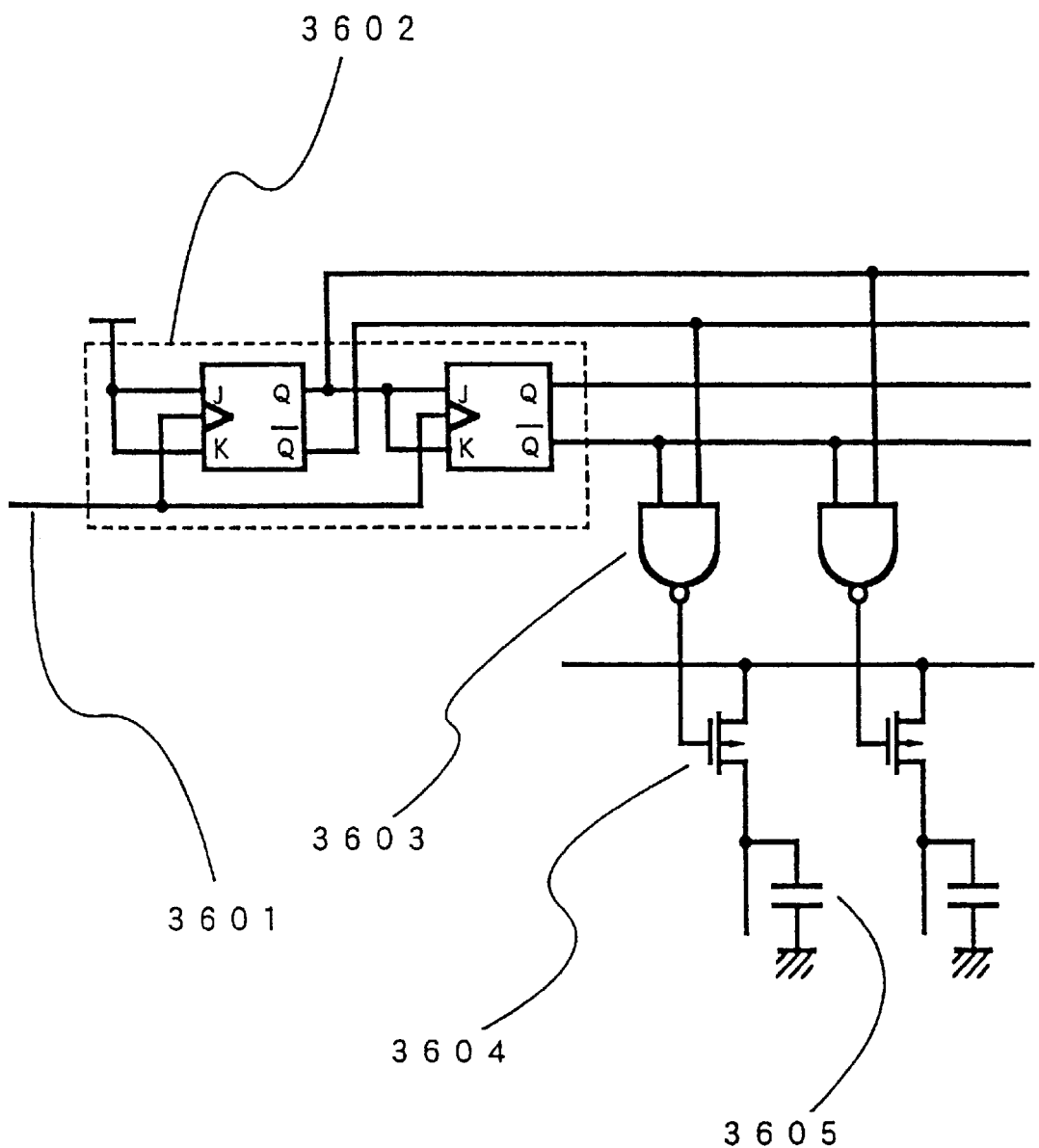
FIG. 36 schematically represents the signal line driver circuit using the counter and the address decoder.
Figure 37:
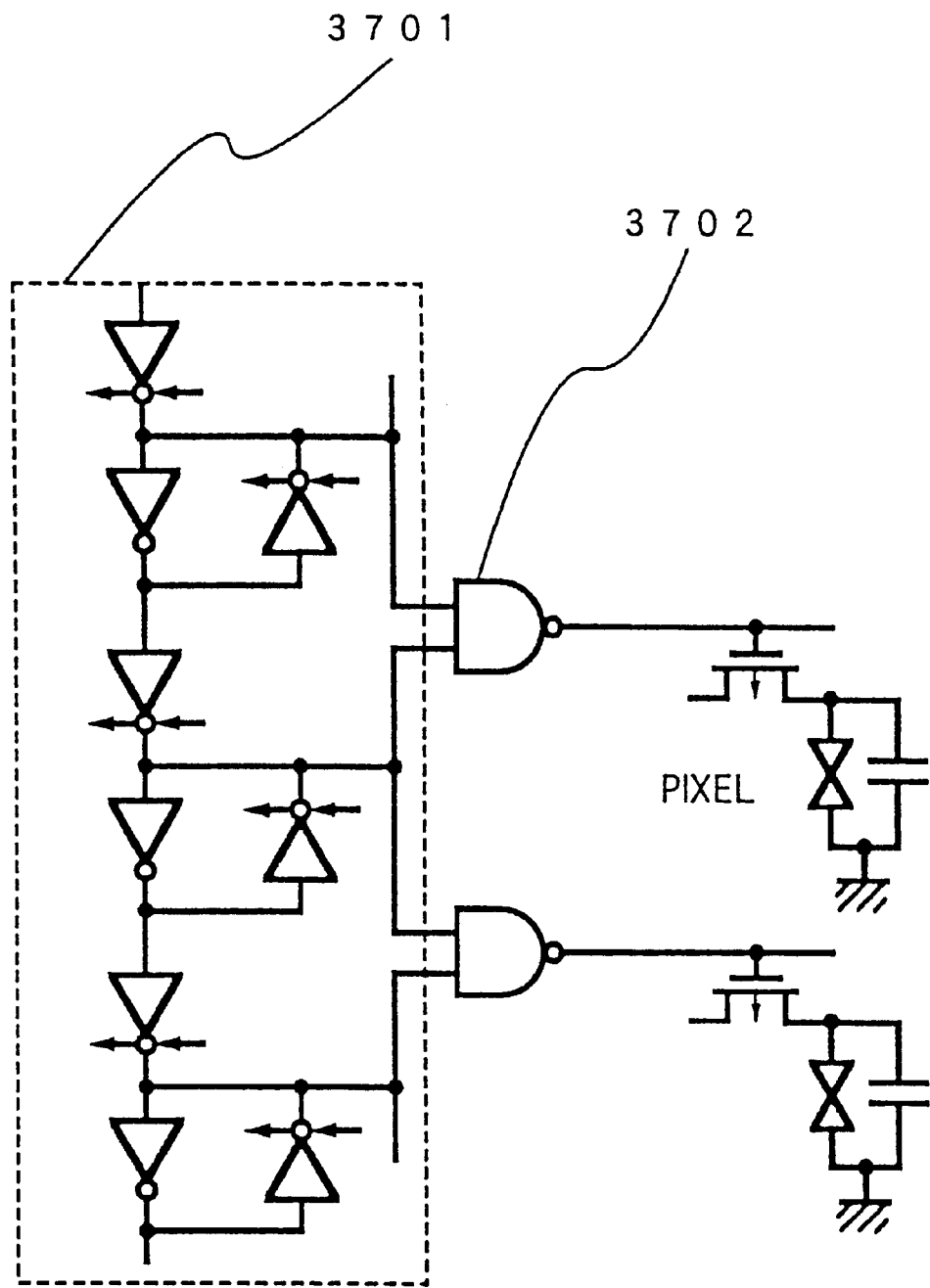
FIG. 37 schematically shows the scanning line driver circuit with using the shift register.

Since there are three resisters in one register of the conventional device of FIG. 32 and thus the power is continuously supplied to all registers, the resultant consumed power would be increased in proportion to a total number of registers. However, in the embodiment 1, although there are three resisters employed in a single register, the power is continuously supplied only to a portion corresponding to the eight registers for the signal transmission and the four registers due to overlapping of the control signal with the adjacent block, but no power is supplied to other registers. As a result, the consumption power for the peripheral driver circuit can be considerably reduced. Even when the total number of registers is increased, there is no change in the consumption power.

As a concrete example, when a shift register having 640 registers are operated under power supply voltage of 20 V and resistance value of 300 KΩ, assuming now that probability is ½ (50%) whether the power supply voltage output, or the ground voltage output is produced, the resultant consumption power could be reduced to 24 mW. To the contrary, the consumption power in the conventional device is 1,280 mW.

EMBODIMENT 2

In the embodiment 2, control circuits are provided with each register and an specific signal to be externally supplied is utilized.

Figure 12A:
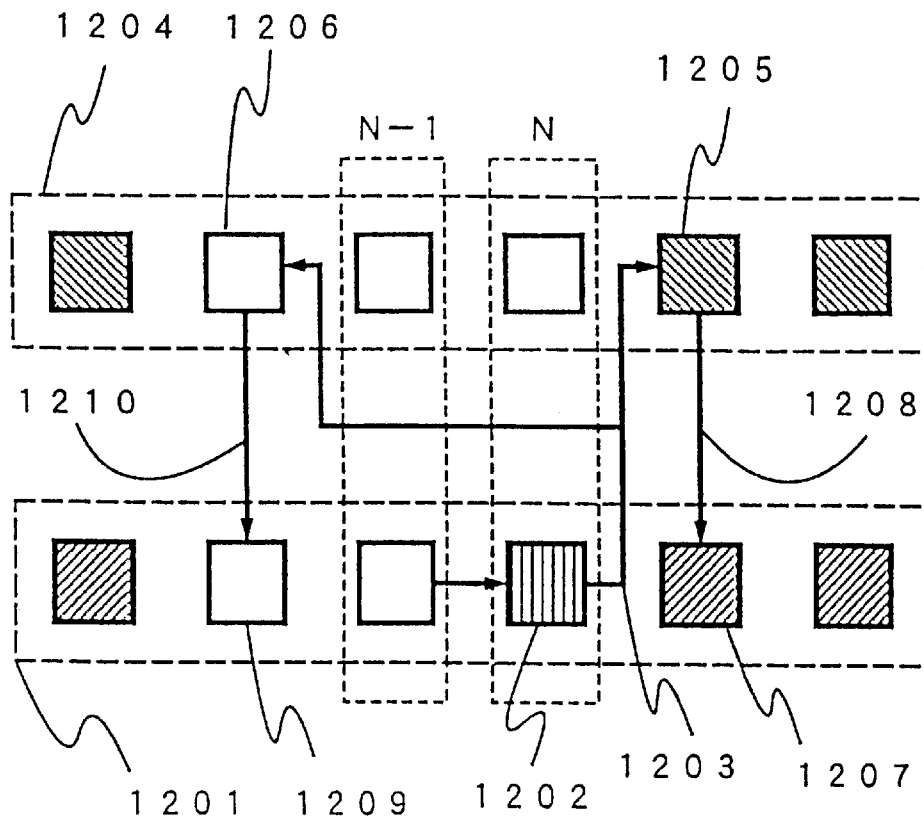
FIG. 12 is a block diagram for showing the embodiment 2.

In FIG. 11, a control circuit 1102 is employed in each register of a shift register 1101 to detect an input signal 1103, so that a control signal 1104 is generated. Concretely speaking, since a pulse width cannot be assured by power supply after an input signal has reached, the shift register is activated before a half period of a basic clock before the input signal is reached, and the power supply is stopped or interrupted just after the output for one period (cycle) is set to an active state. That is, in FIG. 12A, an output 1203 of an nth block 1202 of a shift register 1201 is input to an (n+1)th control circuit and an (n+2)th control circuit 1206 in a control circuit 1204.

When the output 1203 of the nth register 1202 becomes active, the (n+1)th control circuit 1205 produces a control signal 1208 used to supply the power to the (n+1)th register 1207. Also, when the output 1203 of the nth register 1202 becomes active, the (n−2)th control circuit 1206 produces a control signal 1210 used to stop the power supply to the (n−2)th register 1209.

Figure 1:
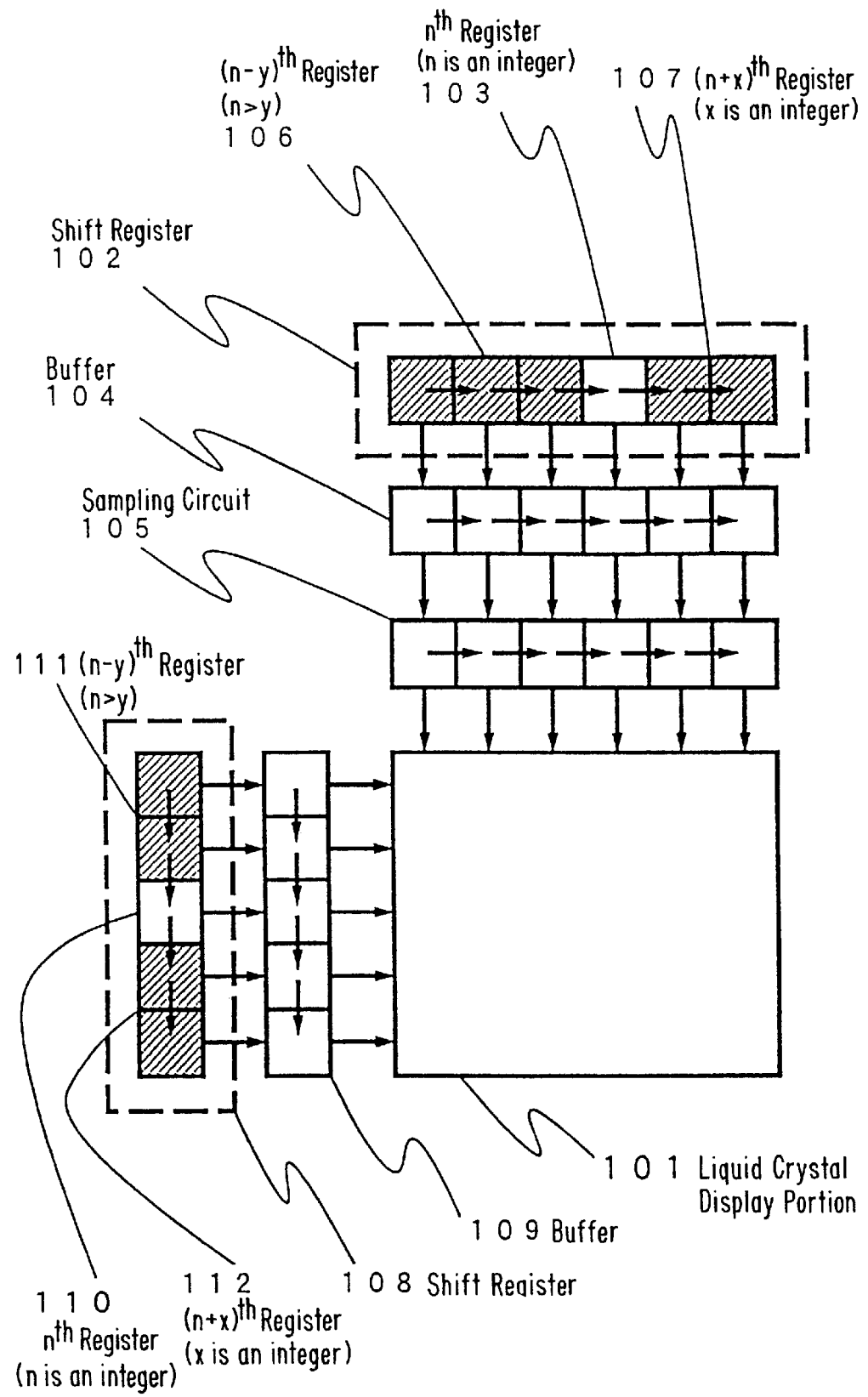
FIG. 1 schematically represents a peripheral driver circuit constructed of a shift register circuit, and a display matrix portion.
Figure 12B:
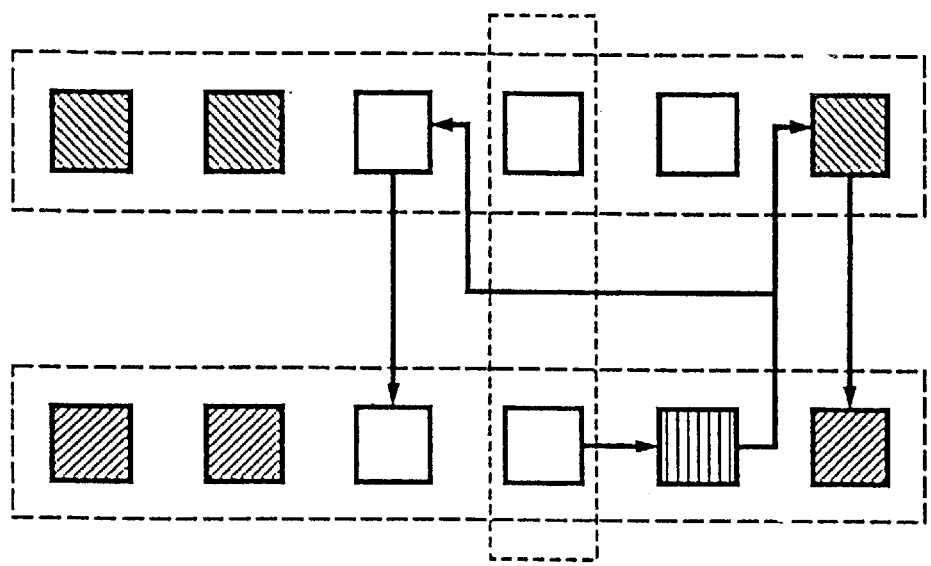

FIG. 12B shows a signal transfer when these state changes are ended and the next clock pulse arrives. In order that the sampler 105 of FIG. 1 is not erroneously operated even when the supply of power to the register is started or stopped, the output of the buffer 104 of FIG. 1 should not be varied. As a consequence, during the period where the output of the buffer 104 of FIG. 1 can be surely obtained and no power is supplied to the shift register 1101 of FIG. 11, the output of the buffer is used as the input of the next register in the embodiment 2, taking account of such a fact that the signal entering in the shift register 1101 are uncertain.

Figure 13:
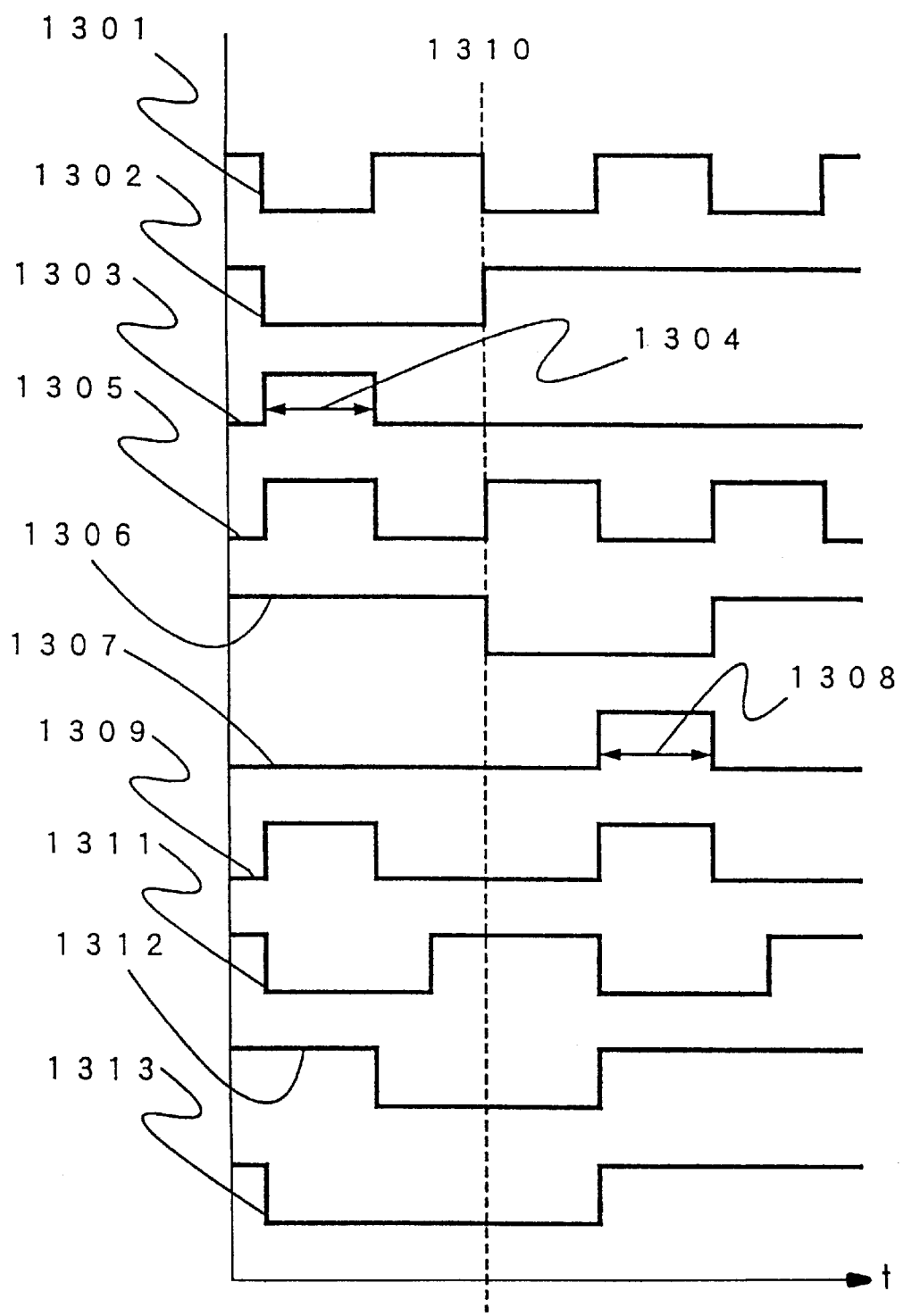
FIG. 13 is a timing chart for indicating operations of the embodiment 2.

Based on the above explanation, there is shown a timing chart for a single register in FIG. 13. A power supply voltage 1304 of an nth adjustment input 1303 is produced from a basic clock 1301 and a buffer output 1302 of the (n−1)th register.

Although one register of the shift register is operated only for a period longer than one period of a basic clock by 1.5 times, since the control signal is delayed from the rising time of the clock and/or the falling time thereof, a signal having a period longer than that of the basic clock by 2 times is produced as an input signal for the nth register of the shift register, and a pulse width is surely set to be equal to one period of the basic clock. That is, a power supply voltage 1308 of an nth adjustment input 1307 is produced from an inverted signal 1305 of the basic clock and a buffer output 1306 of the (N+1)th register. Then, both the input adjustment signals 1303 and 1307 are OR-logic-operated as active high states to produce such an adjustment signal 1309.

Since the buffer output signal 1302 of the (n−1)th register is delayed from the basic clock 1301 to be varied under this condition, an error operation signal is produced during the period 1310 of the adjustment signal 1309. In this case, the buffer output signal 1302 is masked by a clock 1311 having a period longer than that of the basic clock by 1.5 times, so that the operation can be surely performed. A buffer output 1312 of the nth register can be produced by these signals. a power supply signal 1313 in the nth register causes the supply of power to be started at a time before a half period of the basic clock, where the input signal has arrived, so as to avoid variations in the input signal width caused by the element delays.

As the control circuit, such a circuit having no logic circuit is desirable since this control circuit can store, or hold states and must be operated under lower consumption power. In the embodiment 2, it is preferably conceived to construct a circuit mainly arranged by a capacitor, because of a simple circuit arrangement, although frequency characteristics thereof would be deteriorated.

Figure 14:
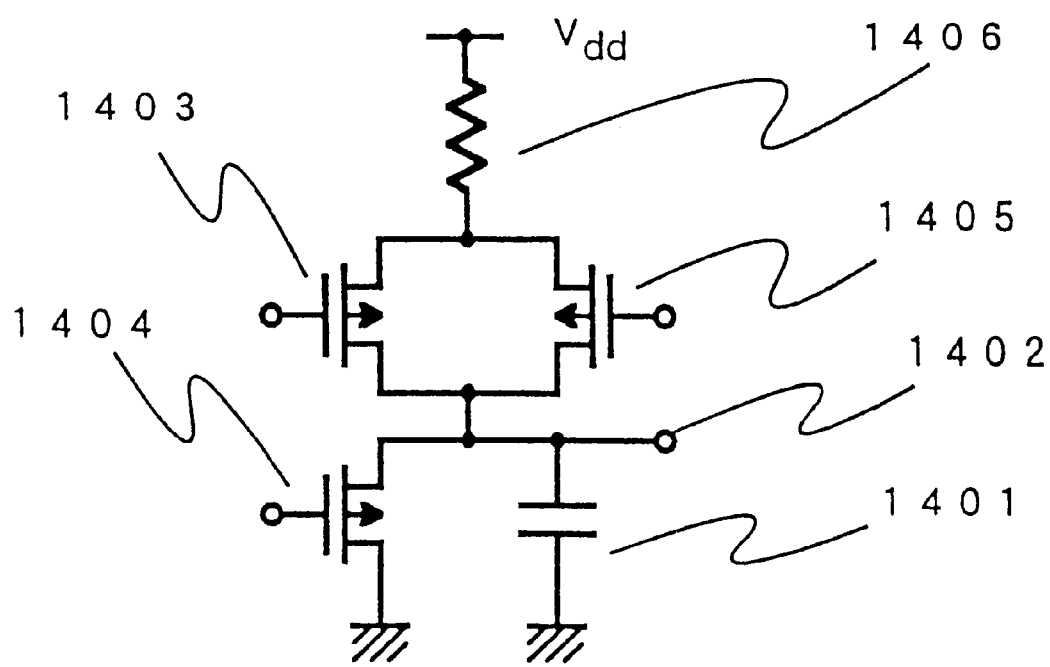
FIG. 14 is a control circuit of the embodiment 2.

FIG. 14 shows a control circuit. Reference numeral 1406 is a resister for protecting a power supply. When a capacitor 1401 is under charging state, a supply of power to a register is interrupted, and a control signal output 1402 for supplying the power to the register is produced under discharge state.

After the power source for the overall circuit is turned on, a P-channel type TFT 1403 sets the control circuit to the initial condition. That is, before the input signal is input to the shift register, the ground voltage signal is applied to the gate electrode of the P-channel type TFT 1403 so as to charge the capacitor 1401.

In order to surely obtain the input signal in the nth control circuit, the nth register is activated at a time when the input signal reaches the (n−1)th register, and then the input signal is acquired at the subsequent clock change. Accordingly, the buffer output of the (n−1)th register is used as the input to the gate electrode of the P-channel type TFT 1404. As a consequence, when the buffer output of the (n−1)th register becomes the ground voltage, the capacitor 1401 is discharged to produce a signal for supplying power to the nth register.

Similarly, in the nth control circuit, when the input signal has reached the (N+2)th register, the nth register is brought into such a condition that no active signal is output, and thus the supply of power may be stopped or interrupted.

Therefore, the buffer output of the (n+2)th register is used as an input to the gate electrode of the P-channel type TFT 1405. As a consequence, when the buffer output of the (n+2)th register becomes the ground voltage, the capacitor 1401 is charged and the supply of power to the nth register is stopped.

Figure 15:
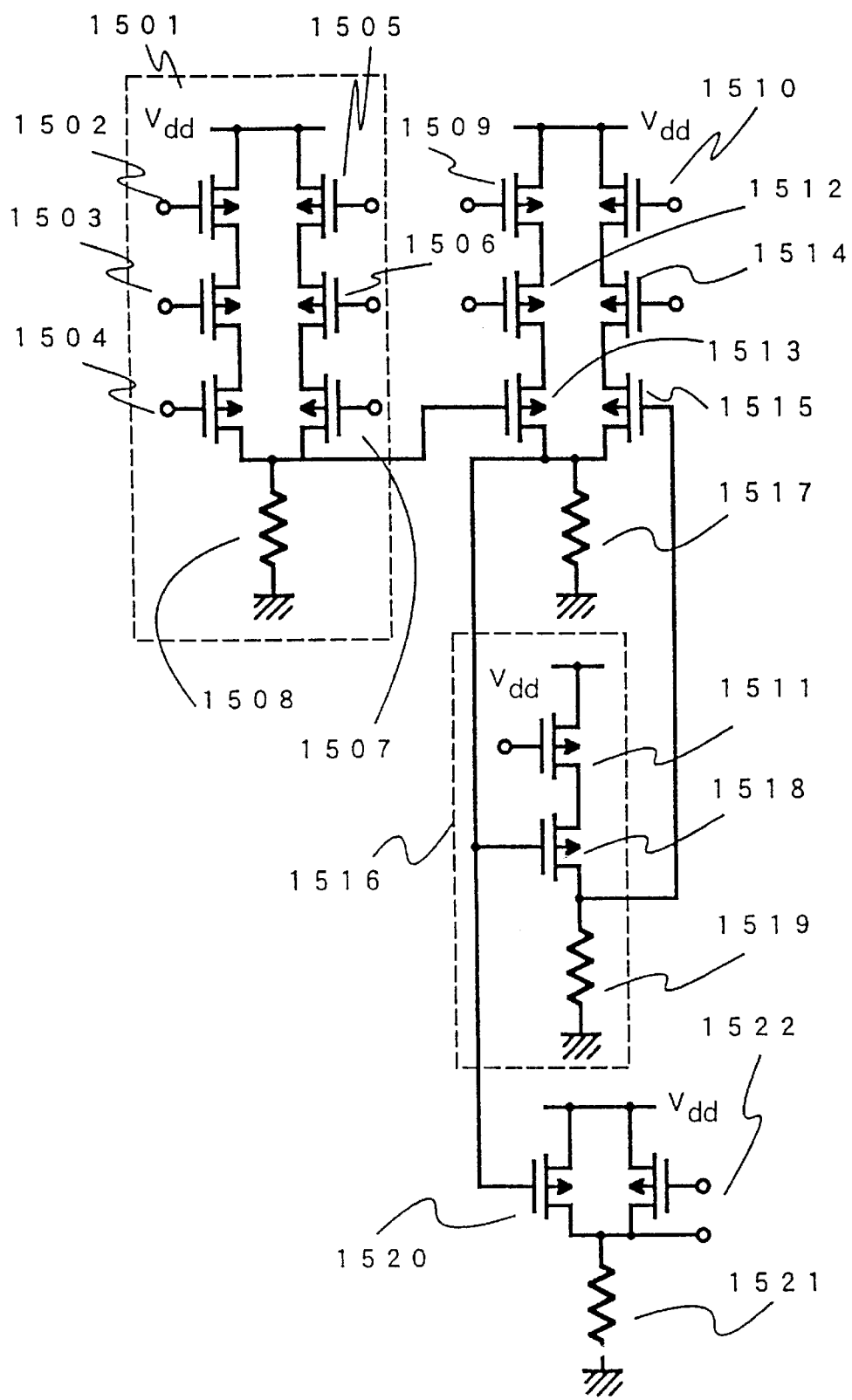
FIG. 15 schematically indicates one register and one buffer in the embodiment 2.

The nth register and the buffer are shown in FIG. 15. In a signal adjusting portion 1501, the basic clock is supplied to a gate electrode of a P-channel type TFT 1502, a clock having a period longer than that of the basic clock by 1.5 times for the masking is applied to a gate electrode of a P-channel type TFT 1503, and the buffer output of the (n−1)th register is applied to a gate electrode of a P-channel type TFT 1504, so that a falling portion of the buffer output of the nth register, namely a signal 1303 of FIG. 13 is produced.

A clock produced by inverting the basic clock is supplied to a gate electrode of a P-channel type TFT 1505, a clock having a period longer than that of the basic clock by 1.5 times for the masking is applied to a gate electrode of a P-channel type TFT 1506, and the buffer output of the (N+1)th register is applied to a gate electrode of a P-channel type TFT 1507, so that a rising portion of the nth register, namely a signal 1307 of FIG. 13 is produced. As a result, an output of the signal adjusting portion 1501 becomes a signal 1309 of FIG. 13. Basically, since the P-channel type TFTs 1504 and 1507 are under off states, no current may normally flow through a resister 1508, and the control signal is not input into the signal adjusting portion.

Conventionally, all registers of the shift register have been operated. However, according to this embodiment, the control signal is applied to the gate electrodes of the P-channel type TFTs 1509, 1510, 1511 and the supply of power is stopped during unnecessary periods to reduce the consumption power in the overall shift register.

The clock having the period longer than that of the basic clock by 1.5 times is applied to a gate electrode of a P-channel type TFT 1512, and the output of the signal adjusting portion 1501 is applied to a gate electrode of a P-channel type TFT 1513, so that a buffer input for a period during the storage loop is not constituted is produced.

An inversion signal of the clock having the 1.5 times longer period is applied to a gate electrode of a P-channel type TFT 1514, and an output of an inverter 1516 for constituting the storage loop is applied to a gate electrode of a P-channel type TFT 1515.

Basically, both the P-channel type TFT 1515 and the resister 1517 constitute an inverter. The storage loop may be constructed of this inverter and another inverter arranged by the P-channel type TFT 1518 and the resister 1519. A P-channel type TFT 1520 and a resister 1521 constitute a buffer.

A P-channel type TFT 1522 is used to define each output of the shift register at the clear operation, and to prevent the charging state of the capacitor of the control circuit from not being ensured. When the current capacitance of the P-channel type TFT is large, the P-channel type TFTs 1509, 1510 and 1511 used to supply the power may be combined with each other.

In the case that the pulse width of the input signal needs not be ensured, the control signal is synchronized with the basic clock and the power may be supplied to a single register only for one period in the structure of embodiment 2.

In the shift register of this embodiment, a comparison will be made consumption power when this shift register is utilized as the peripheral driver circuit of the liquid crystal electro-optical device. The consumed power of a signal resister is defined by dividing a squared value of power supply voltage for each resistor by a resistance value.

Since there are three resistors in one register of the conventional device of FIG. 32, the power is continuously supplied to all registers and the resultant consumed power would be increased in proportion to a total number of registers. However, in the peripheral driver circuit shown in the embodiment 2, although there are three resistors employed in one register, the power is continuously supplied only to the three registers, but no power is supplied to other registers. As a result, consumption power for the peripheral driver circuit can be considerably reduced. Even when the total number of registers is increased, there is no change in consumption power.

As a concrete example, when the shift register having 640 registers is operated under the power supply voltage of 20 V and the resistance value of 300 KΩ, assuming that probability is ½ (50%) whether the power supply voltage output or the ground voltage output is produced, the resultant consumption power could be reduced to 6 mW. To the contrary, the consumption power in the conventional device is 1,280 mW.

EMBODIMENT 3

In an embodiment 3, a control circuit is employed in each register. In the embodiment 3, a circuit for masking a clock is employed in the circuit portion where the erroneous operation is prevented using the clock having the 1.5 times longer period in the embodiment 2. As a result, the signal treatment and the control circuit of the embodiment 3 are similar to those of the embodiment 2.

Figure 16:
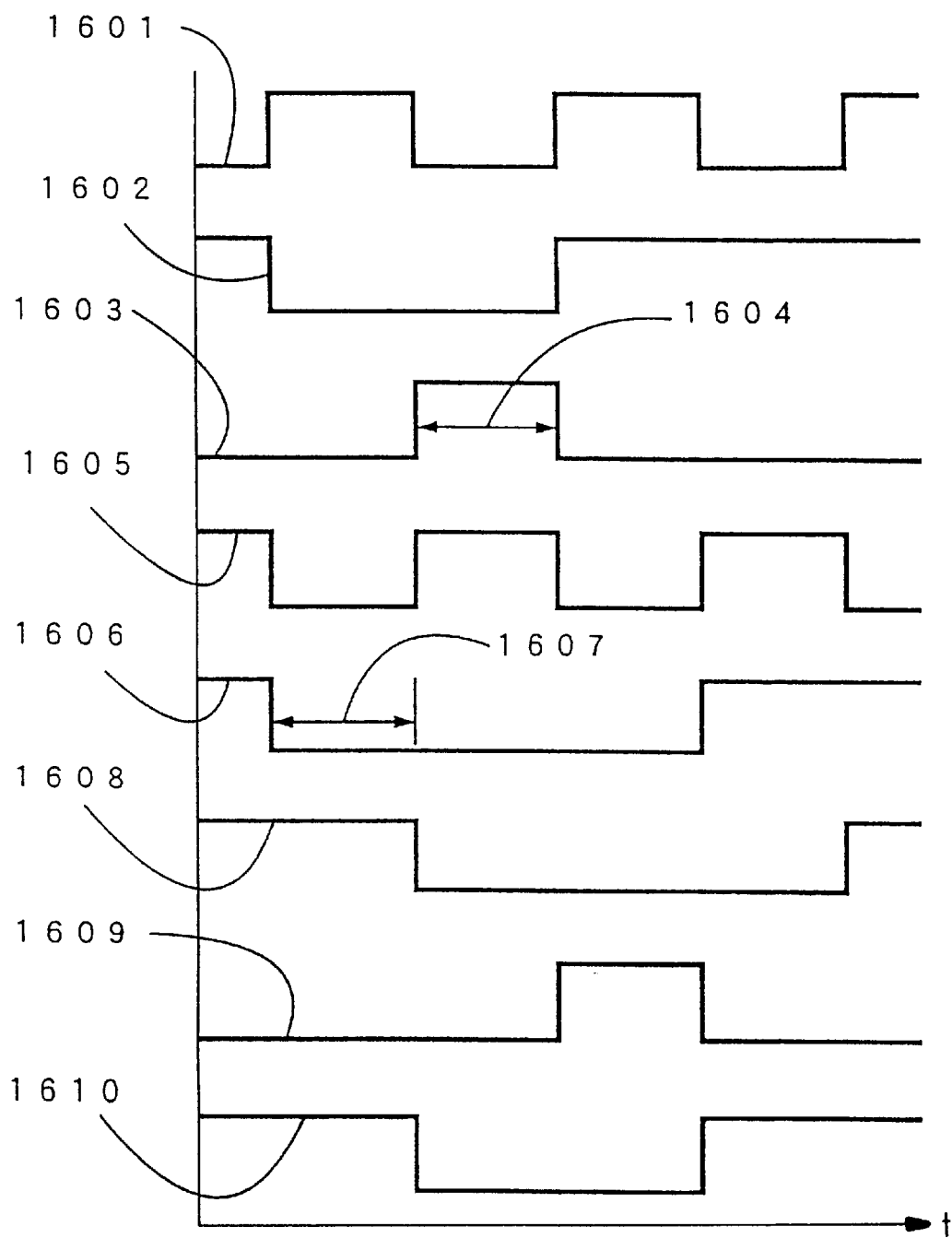
FIG. 16 is a timing chart for showing operations of an embodiment 3 of the present invention.

In FIG. 16, there is shown a timing chart for explaining a single register. In the signal adjusting portion, a power supply voltage 1604 of an nth input 1603 is produced from an inverted clock 1601 of the basic clock and a buffer output 1602 of an (n−1)th register.

As a signal to form a storage loop, a clock 1605 is desired in view of timing. However, since an nth control signal becomes a signal 1606, the storage loop is formed at a time 1607 just after the activation, so that the nth input cannot be accepted. Thus, the clock 1605 is masked by the control signals 1606 and 1608, so that such a loop forming signal 1609 is produced. An output 1610 of the nth buffer is formed by these signals.

Figure 17:
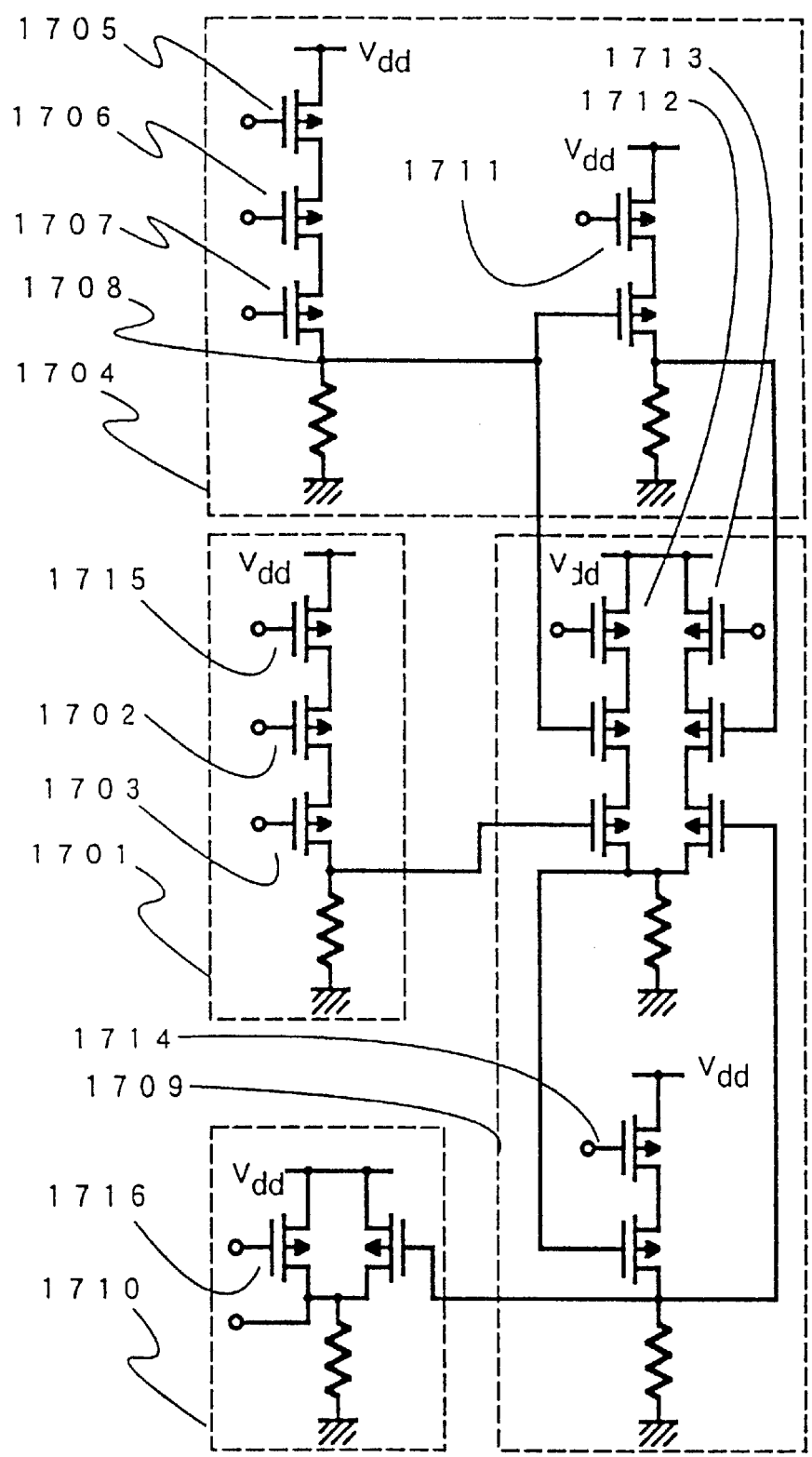
FIG. 17 schematically indicates one register, a circuit for selecting clocks with respect to the one register, and a one buffer, according to the embodiment 3.

An nth register is shown in FIG. 17. As to a signal adjusting portion 1701, the basic clock is applied to a gate electrode of a P-channel type TFT 1702, and a buffer output of the (n−1)th register is applied to a gate electrode of a P-channel type TFT 1703, so that a signal is set when the nth register is activated (initiated).

A circuit 1704 for selecting a clock produces an output 1708 by applying the nth control signal to a gate electrode of a P-channel type TFT 1705, by applying the (n+1)th control signal to a gate electrode of a P-channel type TFT 1706, and by applying an inverted clock of the basic clock to a gate electrode of a P-channel type TFT 1707. The output signal 1708 is inverted to produce a signal for forming a storage loop.

A circuit 1709 for constructing the storage loop, and the buffer circuit 1710 are identical to those of the embodiment 2. P-channel type TFTs 1711, 1712, 1713, 1714 and 1715 are employed to supply the power, whereas a P-channel type TFT 1716 is used to execute the clear operation.

In the shift register of this embodiment, a comparison will be made of consumption power when this shift register is utilized as the peripheral driver circuit of the liquid crystal electro-optical device. The consumed power at a signal register is defined by dividing a squared value of power supply voltage for each resister by a resistance value.

Since there are three resistors in one register of the conventional device of FIG. 32, the power is continuously supplied to all registers and the resultant consumed power would be increased in proportion to a total number of registers. However, in the peripheral driver circuit shown in the embodiment 3, although there are five resistors employed in a single register, the power is continuously supplied only to the three registers, but no power is supplied to other registers. As a result, the consumption power for the peripheral driver circuit can be considerably reduced. Even when the total number of registers is increased, there is no change in the consumption power.

As a concrete example, when the shift register having 640 registers are operated under the power supply voltage of 20 V and the resistance value of 300 KΩ, assuming that probability is ½ (50%) whether the power supply voltage output or the ground voltage output is produced, the resultant consumption power could be reduced to 10 mW. To the contrary, the consumption power in the conventional device is 1,280 mW.

Embodiment 4

In an embodiment 4, a supply of power is carried out during a period equal to two periods of the basic clock.

In the embodiments 2 and 3, the power has been supplied for the period longer than that of the basic clock by 1.5 times. To the contrary, since this power supply operation is performed for two periods of this basic clock in the embodiment 4, the entire circuit may be simplified.

Figure 18A:
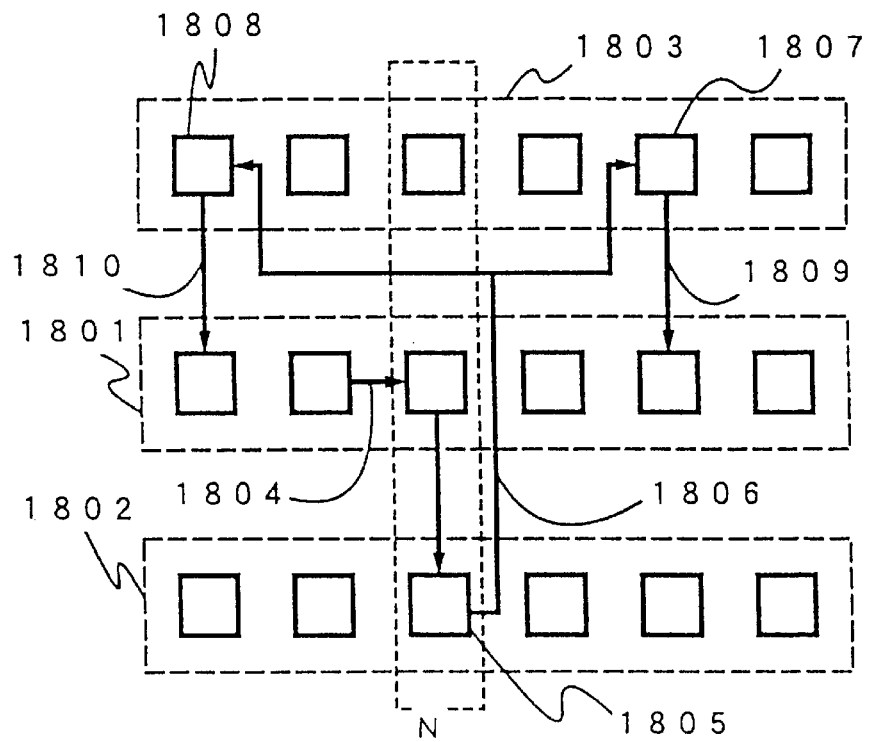
FIG. 18 schematically indicates a block diagram of an embodiment 4.

A flow of signal is shown in FIG. 18A. There is no change in structures of a shift register 1801, a buffer 1802, and a control circuit 1803. When an output of an nth register becomes active in synchronism with the clock by an active output 1804 of an (n−1)th register, an output 1806 of a buffer 1805 corresponding to the nth buffer is varied.

When the buffer output 1806 is input to an (N+2)th control circuit 1807 and an (n−2)th control circuit 1808. When the nth buffer output becomes active, a power supply signal 1809 is produced in the (N+2)th control circuit 1807, whereas a power supply stopping signal 1810 is formed in the (n−2)th control circuit 1808.

Figure 18B:
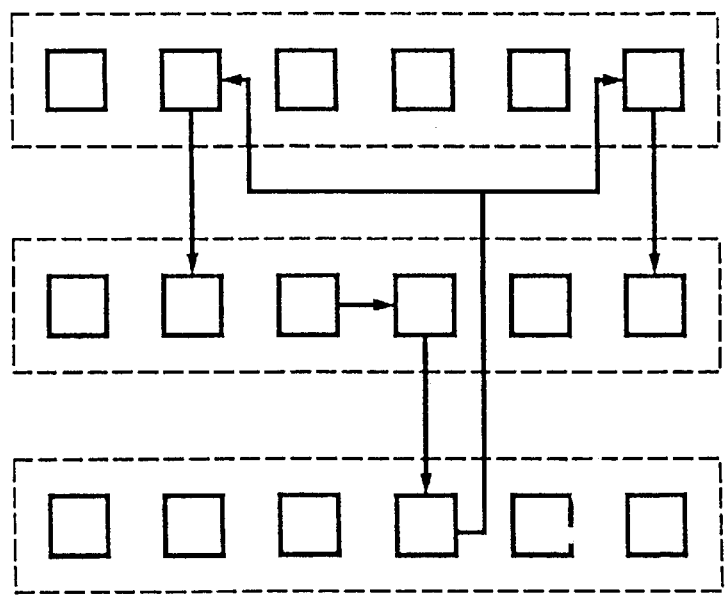

Another signal flow after a half period of the basic clock from the state of FIG. 18A is indicated in FIG. 18B. In the embodiment 4, the output of the nth register is used as the input to the (n+1)th register, without using the output of the nth buffer.

Figure 19:
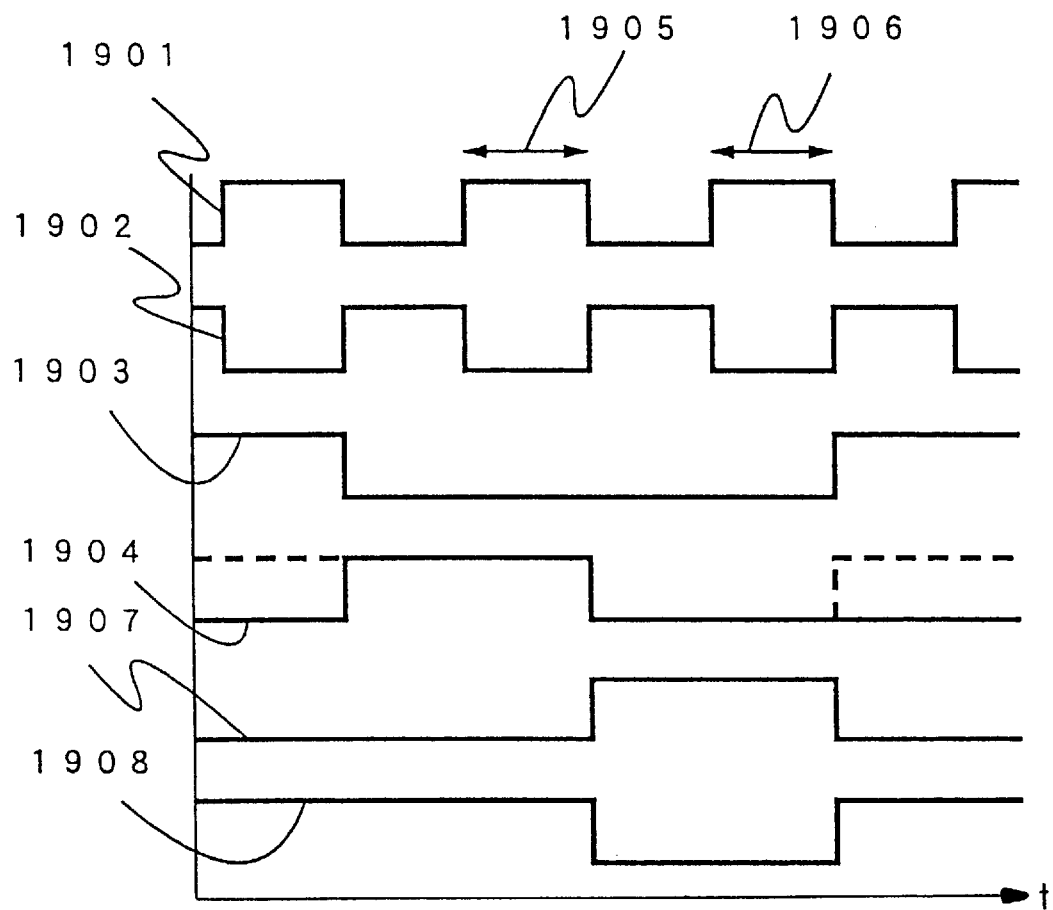
FIG. 19 is a timing chart for indicating operations of the embodiment 4.

A time chart is shown in FIG. 19. In response to a clock 1901, an input signal is acquired, and a clock inversion 1902 constitutes a storage loop. In response to a control signal 1903, the power is supplied only for two periods of the basic clock.

An output 1904 of the nth register is indicated by a solid line. Since the signal is acquired for periods 1905 and 1906 in the (n+1)th register, no longer such a signal acquisition as indicated by a dotted line 1904 is carried out. When a signal 1907 input to the buffer with respect to the nth register is employed, no erroneous operation is performed by a buffer output 1908.

Figure 20:
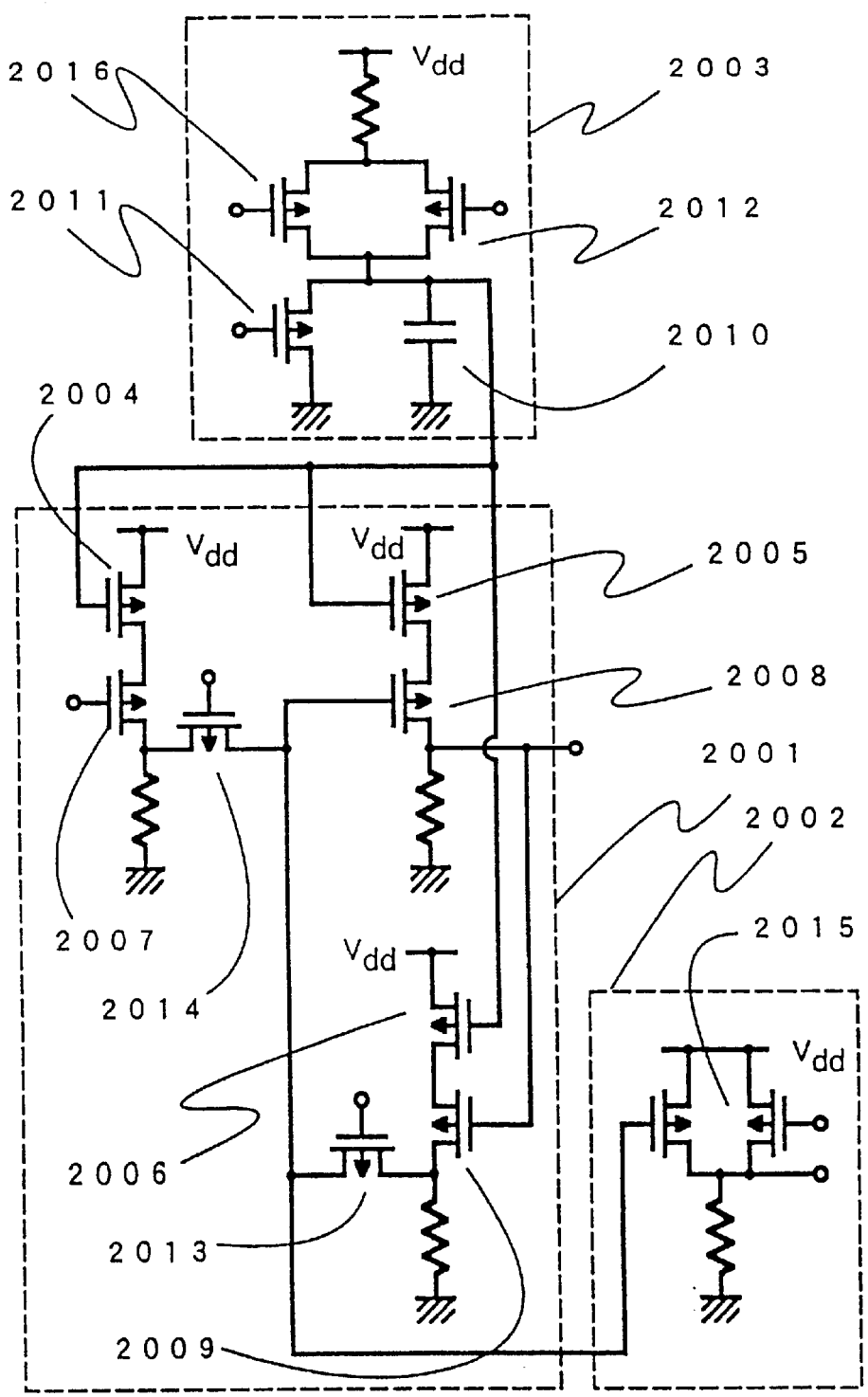
FIG. 20 is a one register, a control circuit for the one register, and a one buffer, according to the embodiment 4.

In FIG. 20, there is shown a circuit diagram of the embodiment 4. An output of an nth register 2001 is used as an input to a buffer 2002 of the nth register and an (n+1)th register. An output of the buffer 2002 becomes an input to (n+2)th and (n−2)th control circuits 2003, thereby producing a control signal. A shift register is so arranged that P-channel type TFTs 2004, 2005, 2006 for supplying the power are series-connected to the respective inverters of the shift register shown in FIG. 32. The source electrodes of the P-channel type TFTs 2007, 2008, 2009 which constitute the inverter may be combined at one point, and may be connected to the power supply via a single P-channel type TFT for controlling the supply of power.

The buffer circuit 2002 and the control circuit 2003 have the same arrangements as those of the embodiment 2. That is, an input to a gate electrode of a P-channel type TFT 2011 which discharges an nth control circuit capacitor 2010 corresponds to an output of the (n−2)th buffer, and an input to a gate electrode of a P-channel type TFT 2012 for charging corresponds to an output of the (n+2)th buffer. P-channel type TFTs 2013 and 2014 are a clock synchronized analog switch, and P-channel type TFTs 2015 and 2016 are employed to carry out the clear operation.

As to the shift register of this embodiment, a comparison will be made of consumption power when this shift register is utilized as the peripheral driver circuit of the liquid crystal electro-optical device. The consumed power of a signal register is defined by dividing a squared value of power supply voltage for each resister by a resistance value. There are three resistors in one register of the conventional device of FIG. 32 and the power is continuously supplied to all registers. Accordingly, the resultant consumed power would be increased in proportion to a total number of registers. However, in the peripheral driver circuit of the embodiment 4, although there are three resistors employed in a single register, the power is continuously supplied only to the four registers, but no power is supplied to other registers. As a result, the consumption power for the peripheral driver circuit can be considerably reduced. Even when the total number of registers is increased, there is no change in the consumption power.

As a concrete example, when A shift register having 640 register is operated under the power supply voltage of 20 V and the resistance value of 300 KΩ, assuming that probability is ½ (50%) whether the power supply voltage output or the ground voltage output is produced, the resultant consumption power could be reduced to 8 mW. To the contrary, consumption power in the conventional device is 1,280 mW.

In the embodiments 1 to 4, according to the present invention, the power is supplied only to the required registers so as to be operated, so that the consumption power in the overall peripheral driver circuit of the liquid crystal electro-optical device could be greatly reduced. Even when the shift register circuit with high consumption power is employed, very low consumption power could be realized for the overall peripheral driver circuit. An increase in the consumption power in conjunction with an increase in a total number of registers could be prevented.

In embodiments 5 to 7, there are represented such circuit arrangements that when a pixel is specified, a power supply voltage is set to be a required value. This may be another circuit arrangement for lowering a power supply voltage of a circuit portion which has no function.

EMBODIMENT 5

Figure 21:
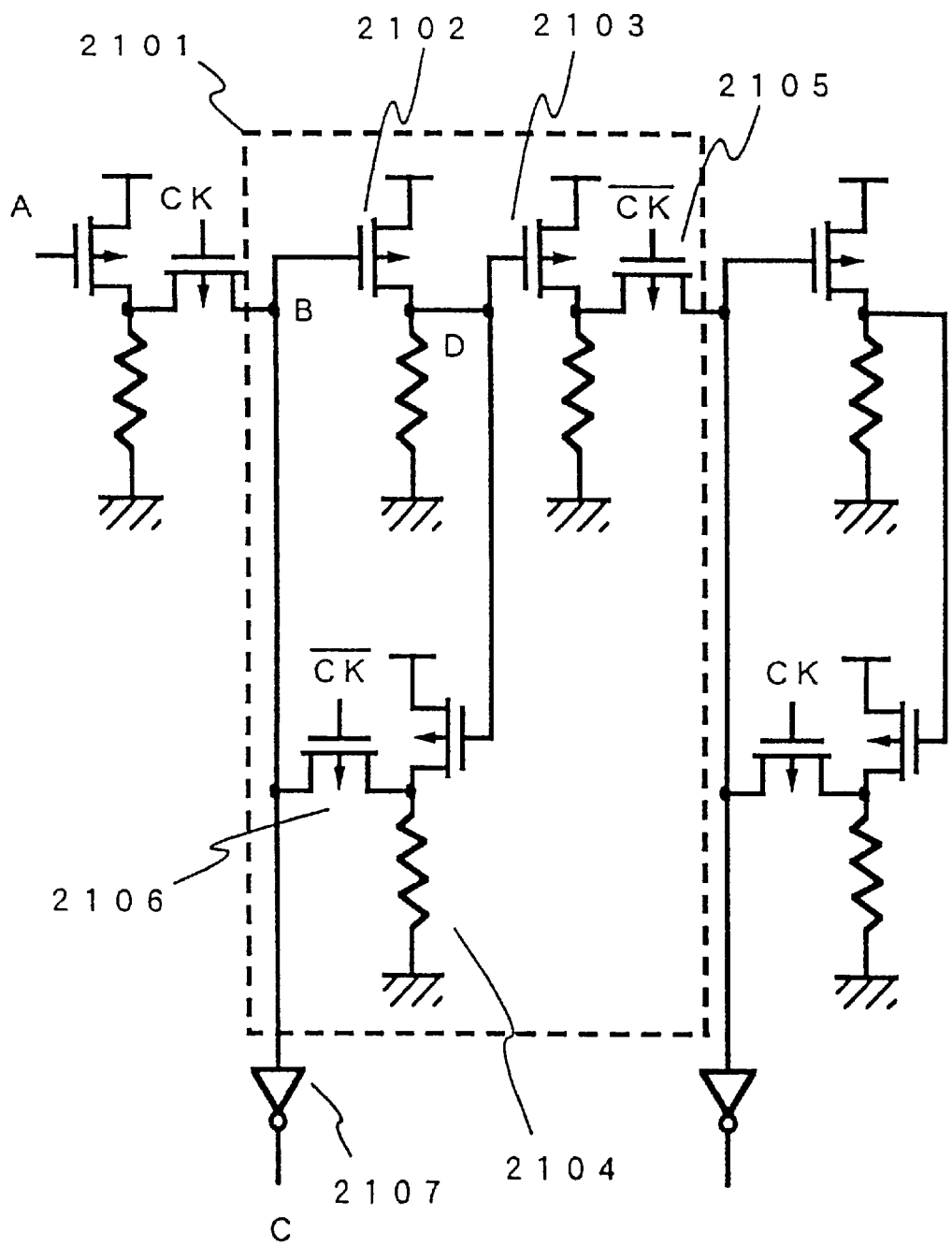
FIG. 21 is a shift register constructed of one conductivity type TFTs according to an embodiment 5.

In an embodiment 5, a shift register circuit is employed to constitute a peripheral driver circuit, and it is assumed that the circuit is realized by employing one conductivity type TFT, namely a P-channel type TFT and a resistor in this case. FIG. 21 shows a shift register circuit. In this embodiment, one register (stage) 2101 of the shift register circuit corresponds to a circuit arranged by three inverters 2102, 2103, 2104, and two analog switches 2105 and 2106. A buffer 2107 causes the analog switches to be turned on/off.

Figure 22:
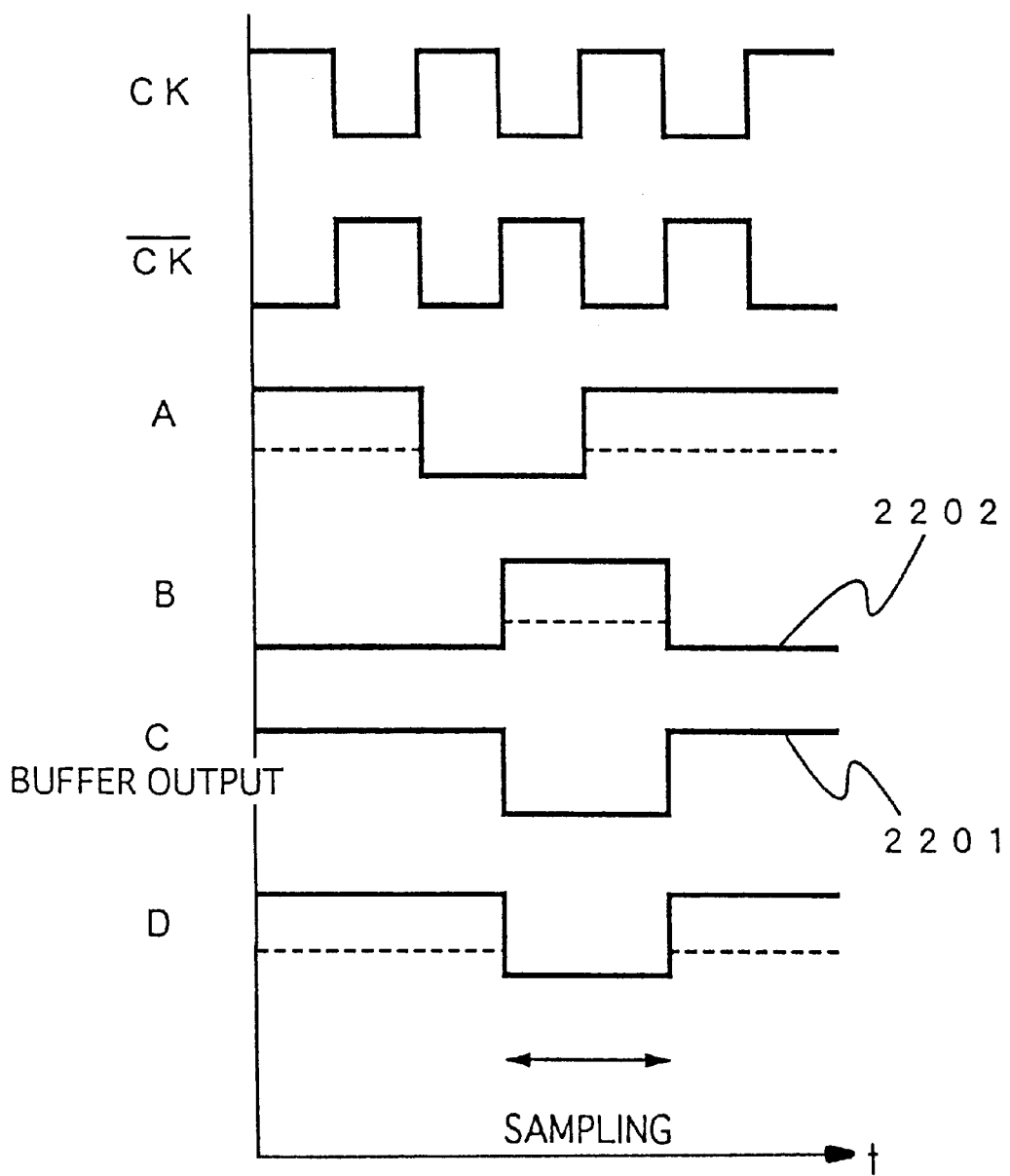
FIG. 22 is a timing chart for showing operations of a shift register of the embodiment 5.

In FIG. 22, a solid line indicates a power supply voltage capable of driving a liquid crystal, and a dotted line shows a power supply voltage capable of realizing low consumption power. Considering a voltage variation range of a video signal for driving a liquid crystal, a power supply voltage of about 20 V is needed in a buffer to operate an analog switch. Therefore, a buffer output 2201 for turning on/off the analog switch constructed of P-channel TFTs becomes normally the power supply voltage of approximately 20 V, and becomes the ground voltage at sampling. As a result, such a waveform 2202 is required as the buffer input, which becomes normally the ground voltage, and a voltage of about 20 V at sampling.

It is considerable that a shift register circuit for producing the buffer input shifts the sampling timing as the input signal. Accordingly, when the sampling timing is produced in the shift register circuit, namely when the input signal is present in the nth register of the shift register circuit, assuming that the power supply voltage with respect to the nth register is about 20 V, the liquid crystal can be driven via the buffer, the analog switch, and the video signal. When no input signal is present, the power supply voltage of the shift register circuit can be lowered within a range where the shift register circuit is not erroneously operated. Since the power supply voltage for driving the liquid crystal is not permanently used but the power supply voltage can be lowered within the range where the logic is not inverted in this circuit arrangement, consumption power can be reduced.

Figure 23:
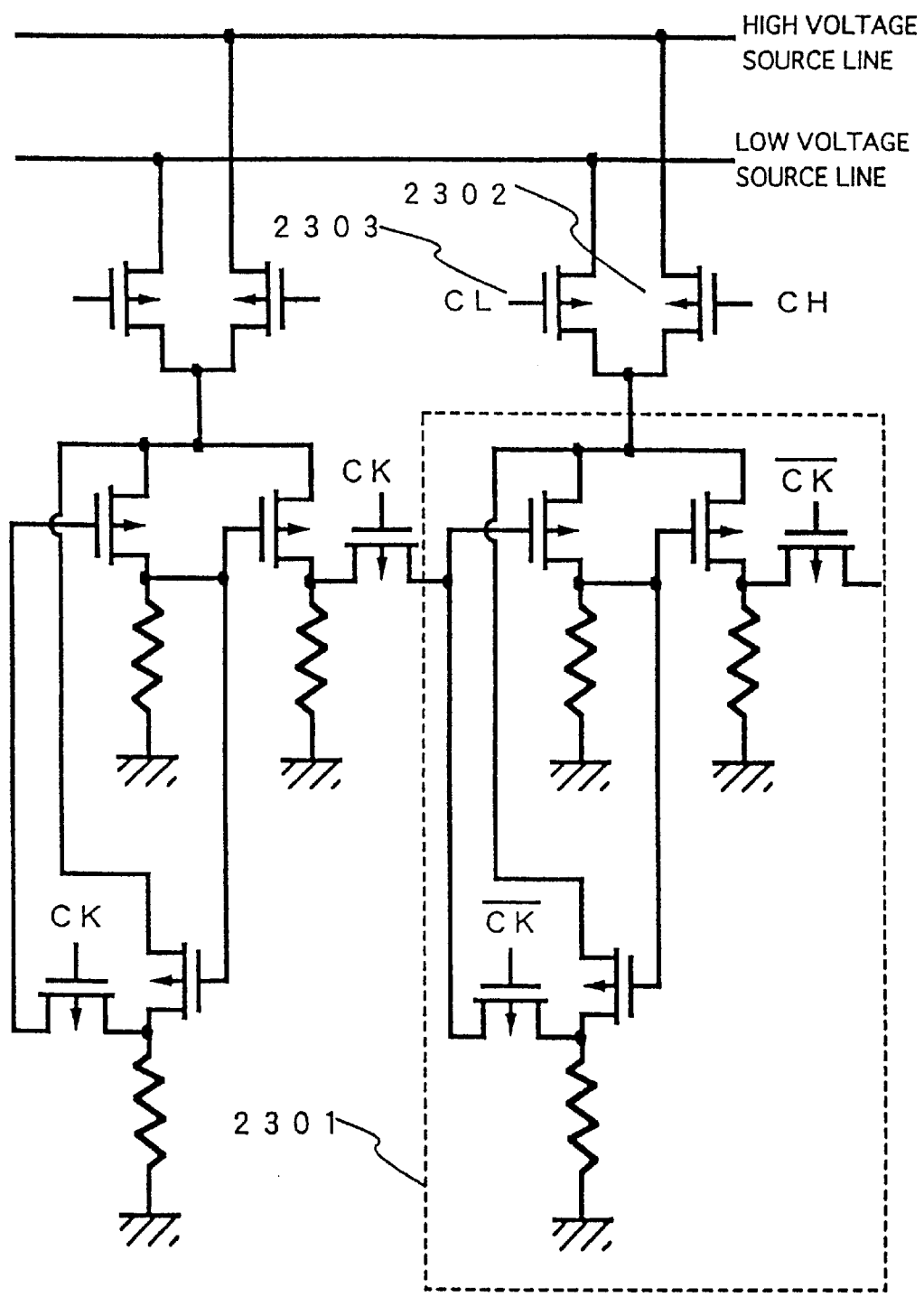
FIG. 23 schematically indicates a power supply voltage switching circuit of the shift register constructed of the one conductivity type TFTs according to the embodiment 5.

FIG. 23 shows a circuit arrangement for supplying a power supply voltage capable of driving a liquid crystal and a power supply voltage capable of realizing low consumption power to one register 2301 of a shift register circuit. A P-channel type TFT 2302 is brought into an on state and also a P-channel type TFT 2303 is brought into an on state, so that a power supply voltage (high power supply voltage) capable of driving a liquid crystal and another power supply voltage (low power supply voltage) capable of realizing lower consumption power can be supplied.

Figure 24:
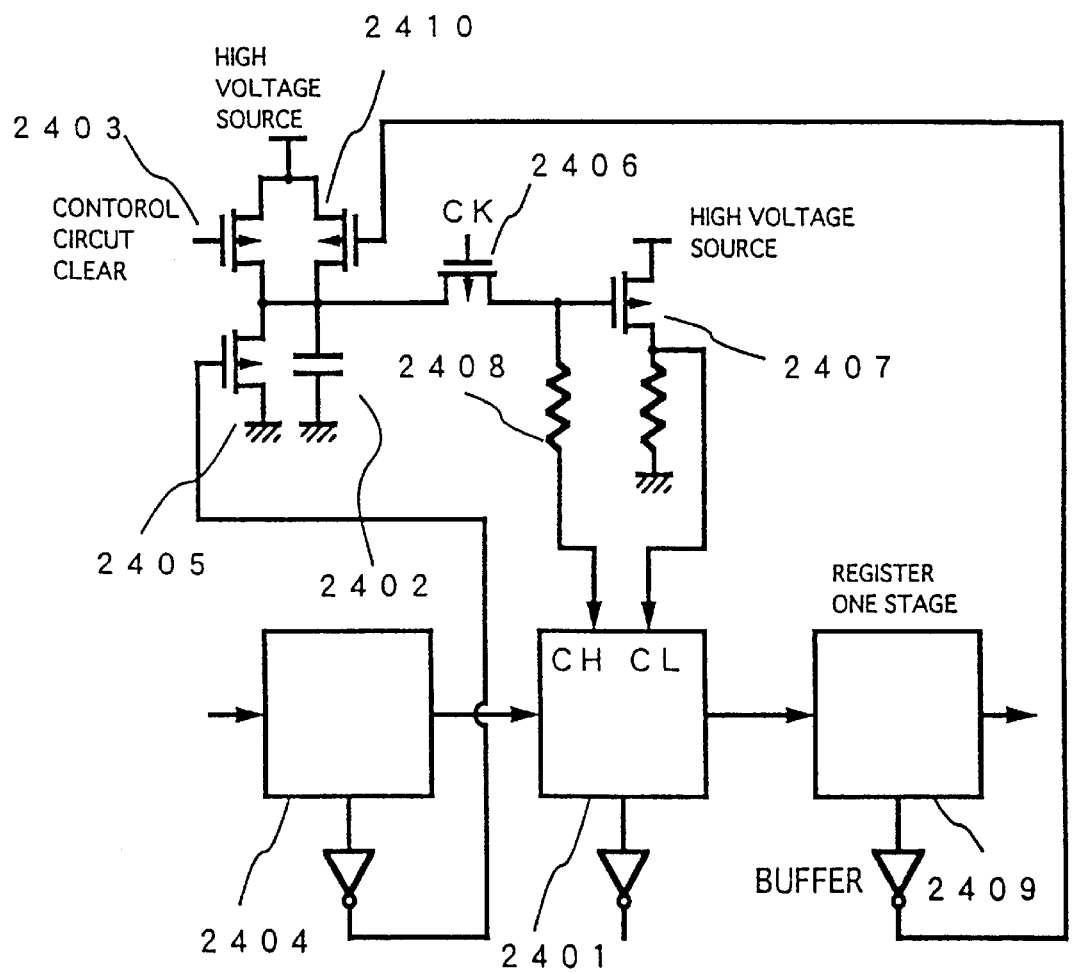
FIG. 24 schematically shows a power supply voltage switching control circuit of the embodiment 5.

FIG. 24 shows a circuit for controlling a power supply (power source) circuit. In FIG. 24, there are shown a control circuit corresponding to an nth register 2401 of a shift register circuit, and a method for extracting a signal for operating the control circuit.

A capacitor 2402 of the control circuit corresponding to the nth register of a shift register circuit is operated as follows. While the capacitor 2402 is charged to the voltage capable of driving the liquid crystal, the power supply voltage capable of realizing low consumption power is applied to the nth shift register of a shift register circuit.

Conversely, while this capacitor is discharged to a voltage near the ground voltage, the power supply voltage capable of driving the liquid crystal is applied to the nth register of a shift register circuit.

The control circuit is operated as follows. The P-channel type TFT 2403 is previously turned on to charge the capacitor 2402 up to such a voltage capable of driving the liquid crystal. After charging, the P-channel type TFT 2403 is turned off. In initial state, the power supply voltage capable of realizing low consumption power is supplied. The output of the (n−1)th register 2404 of the shift register circuit is connected via a buffer to a gate electrode of a P-channel type TFT 2405. As a consequence, when an input signal reaches the (n−1)th register of the shift register circuit, the capacitor is discharged to a voltage near the ground voltage. The voltage at the capacitor becomes a power supply voltage control signal capable of driving the liquid crystal in synchronism with the clock by the P-channel type TFT 2406. Then, this control signal becomes another power supply voltage control signal capable of realizing low consumption power via an inverter 2407. As a result, when the capacitor of the control circuit corresponding to the nth register of the shift register circuit is discharged, the power supply voltage capable of driving the liquid crystal is applied to the nth register of the shift register circuit, so that the supply of power capable of realizing low consumption power is stopped. When the power supply voltage of the shift register becomes low, the output of the shift register may erroneously operate the control circuit with the high power supply voltage. To avoid this, the buffer output which is continuously used under the power supply voltage capable of driving the liquid crystal is employed.

Also, due to time delays of the inverter, there are some possibility that the power supply control signal simultaneously turns on both the P-channel type TFTs 2302 and 2303, whereby the power supply is short-circuited. Therefore, the power supply voltage control signal capable of driving the liquid crystal is distorted by a resistor 2408 to delay that the P-channel type TFT 2302 is brought into an on state, so that the short circuit of the power supply circuit can be avoided.

Further, an output of an (N−1)th register 2409 of the shift register circuit is connected through a buffer to a gate electrode of a P-channel type TFT 2410. When the input signal reaches the (n+1)th register of the shift register circuit, the capacitor is charged to such a power supply voltage capable of driving the liquid crystal. As a result, the power supply voltage capable of realizing lower consumption power is applied to the nth register of the shift register circuit, so that the supply of power capable of driving the liquid crystal is stopped.

With this circuit arrangement, the power supply voltage can be set to a necessary value only when the analog switch is turned on for sampling. In other case, the power supply voltage is set to such a voltage capable of realizing low consumption power, so that lower consumption power of the overall circuit can be realized.

Figure 40:
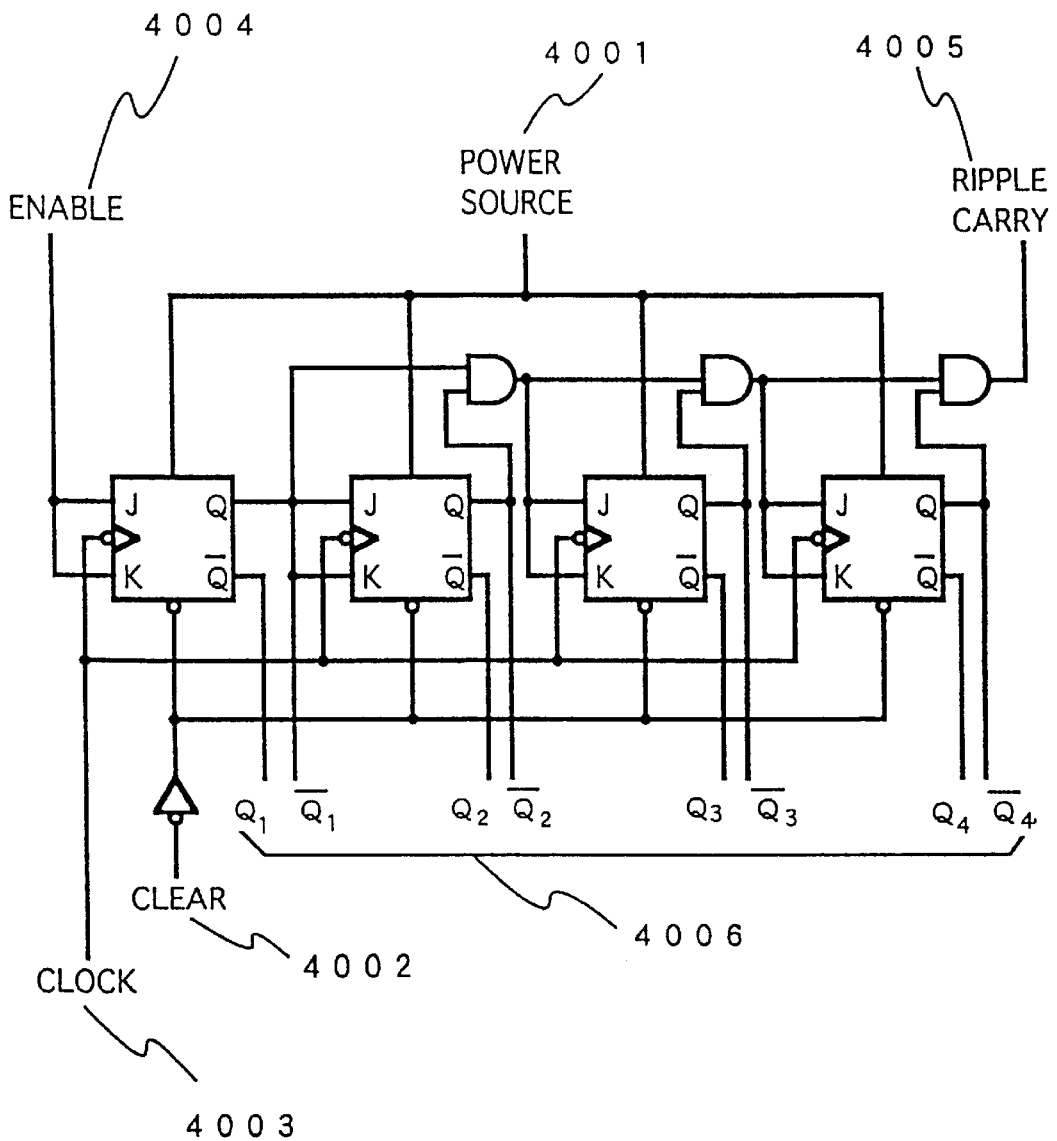
FIG. 40 schematically indicates the arrangement of the 4-bit counter.

With respect to the peripheral driver circuit of this embodiment, a comparison is made of consumption power. The consumed power at a signal register is defined by dividing a squared value of power supply voltage for each resister by a resistance value. The voltage of 20 V capable of driving the liquid crystal is continuously applied to the circuit shown in FIG. 40, whereas there are three resistors in one register of a shift register circuit and a resistance value thereof is 300 KΩ, assuming that probability is ½ (50%) whether the power supply voltage output or the ground voltage output is produced. When the shift register circuit is arranged by 640 registers and the buffer is eliminated, the consumption power is 1280 mW. In this embodiment, the following results are obtained. That is, assuming that the liquid crystal drive voltage is 20 V, the voltage capable of low consumption power is 5 V, four resistors are employed in one register, and a resistance value thereof is 300 KΩ, the power supply voltage capable of driving the liquid crystal is applied only to the two registers of the shift register circuit constructed of 640 registers, whereas the power supply voltage capable of realizing low consumption power is applied to the remaining 638 registers of the shift register circuit. Based on these assumptions, the resultant consumed power may be calculated as 111 mW. Therefore, consumption power can be lowered in this embodiment.

EMBODIMENT 6

In the embodiment 6, there is shown a circuit arrangement for supplying power only to a portion for specifying a pixel and for stopping (interrupting) the supply of power to a portion not for specifying a pixel. In this embodiment, such a circuit is assumed that a pixel is specified by employing a decoder circuit and a counter circuit.

Figure 38A:
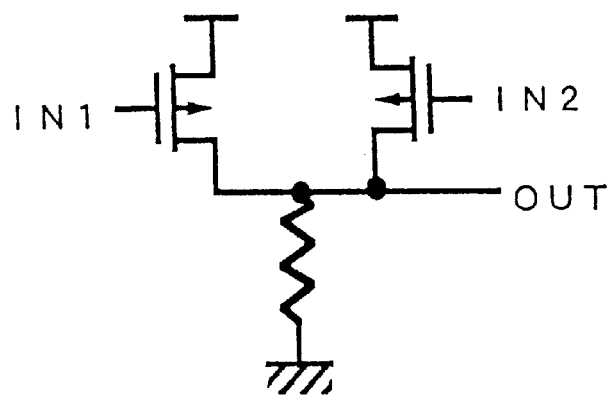
FIG. 38 schematically illustrates the basic gate arrangement constructed of the one conductivity type TFT.
Figure 38B:
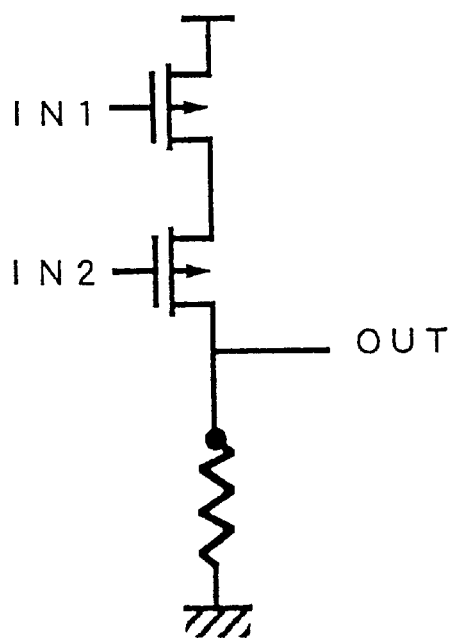
Figure 38C:
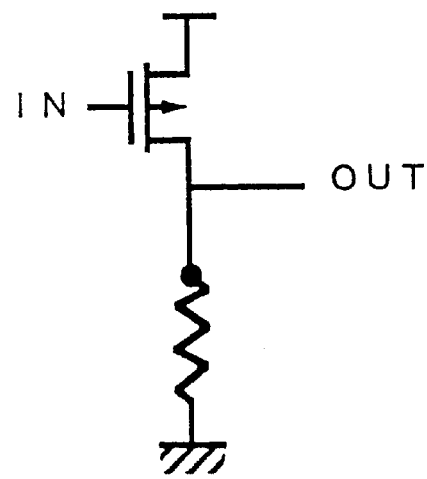
Figure 39:
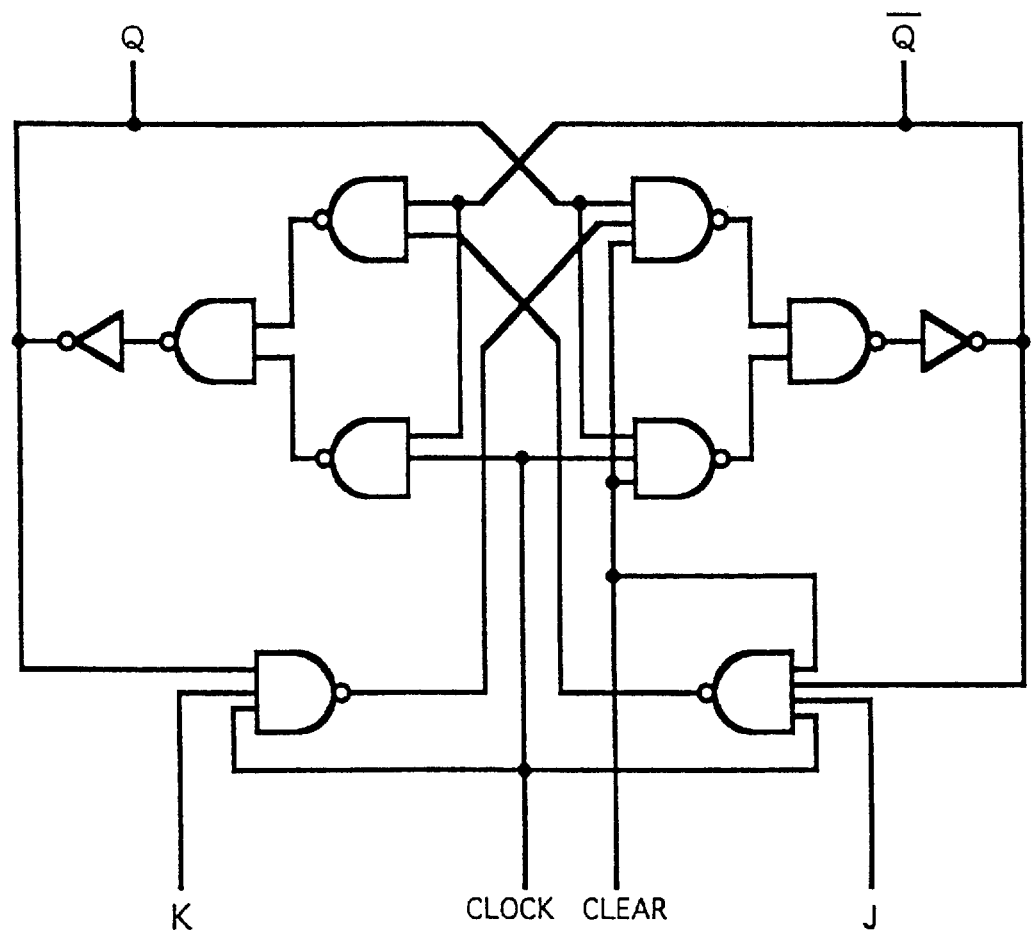
FIG. 39 schematically shows the arrangement of the J/K flip-flop.

An output (containing an inverted output) of the counter circuit is passed through the decoder circuit arranged by the gate of FIG. 38, so that a signal for specifying a pixel is produced. When the decoder circuit has the function of a buffer, since the consumption power is decreased, power to the counter circuit is reduced. It is impossible to separate the counter circuit into the portion for specifying the pixel and the portion not for specifying the pixel with the circuit arrangement of FIG. 40, so that this counter circuit is subdivided.

Figure 25:
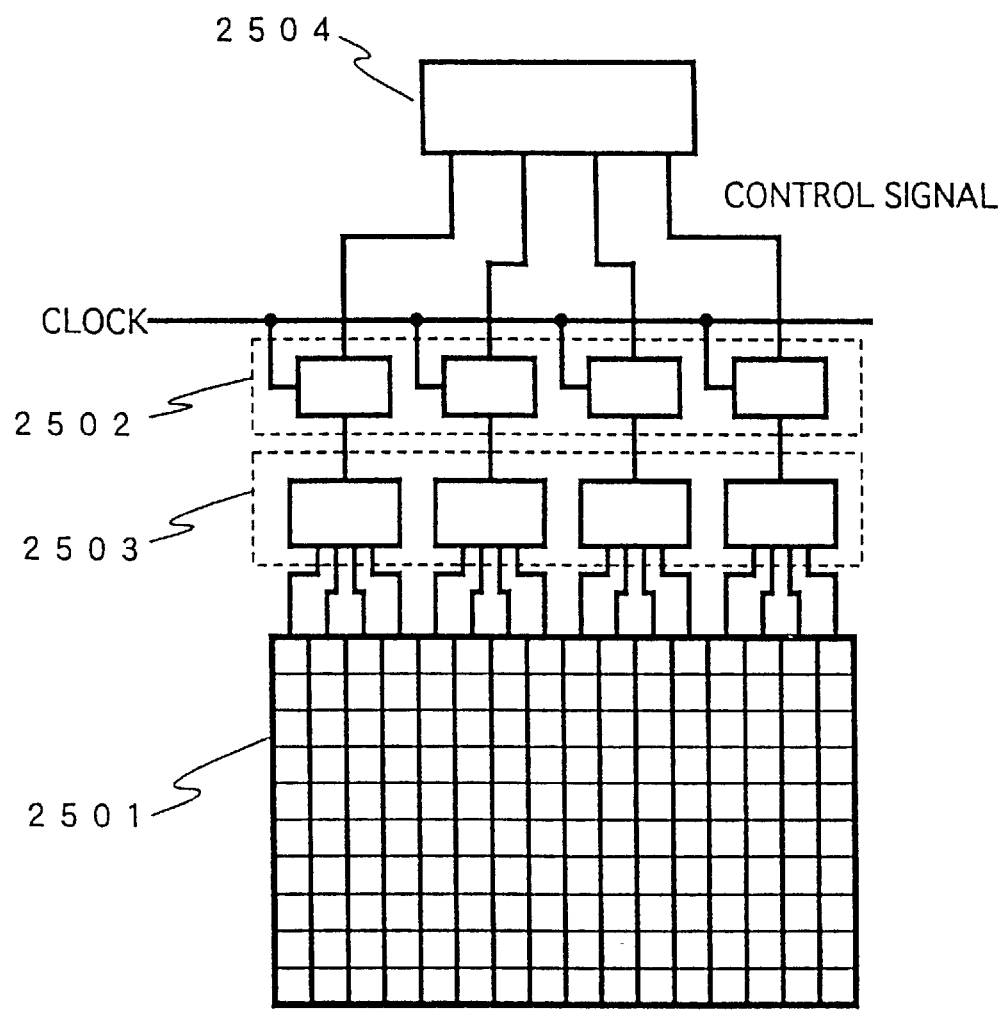
FIG. 25 is a counter and a decoder, which are divided according to an embodiment 6.

An address corresponding to either a signal line or a scanning line is produced not by a single counter, but by employing a counter circuit having a less bit number as shown in FIG. 25. A necessary number of counter circuits are prepared and these counter circuits are sequentially driven to produce local addresses, so that the pixel is specified. As a consequence, the supply of power to such a counter circuit which is not required to be operated can be stopped. In this figure, reference numeral 2501 is a pixel matrix; 2502 is a subdivided counter circuit; 2503 is a decoder circuit; and 2504 is a control circuit.

Figure 26:
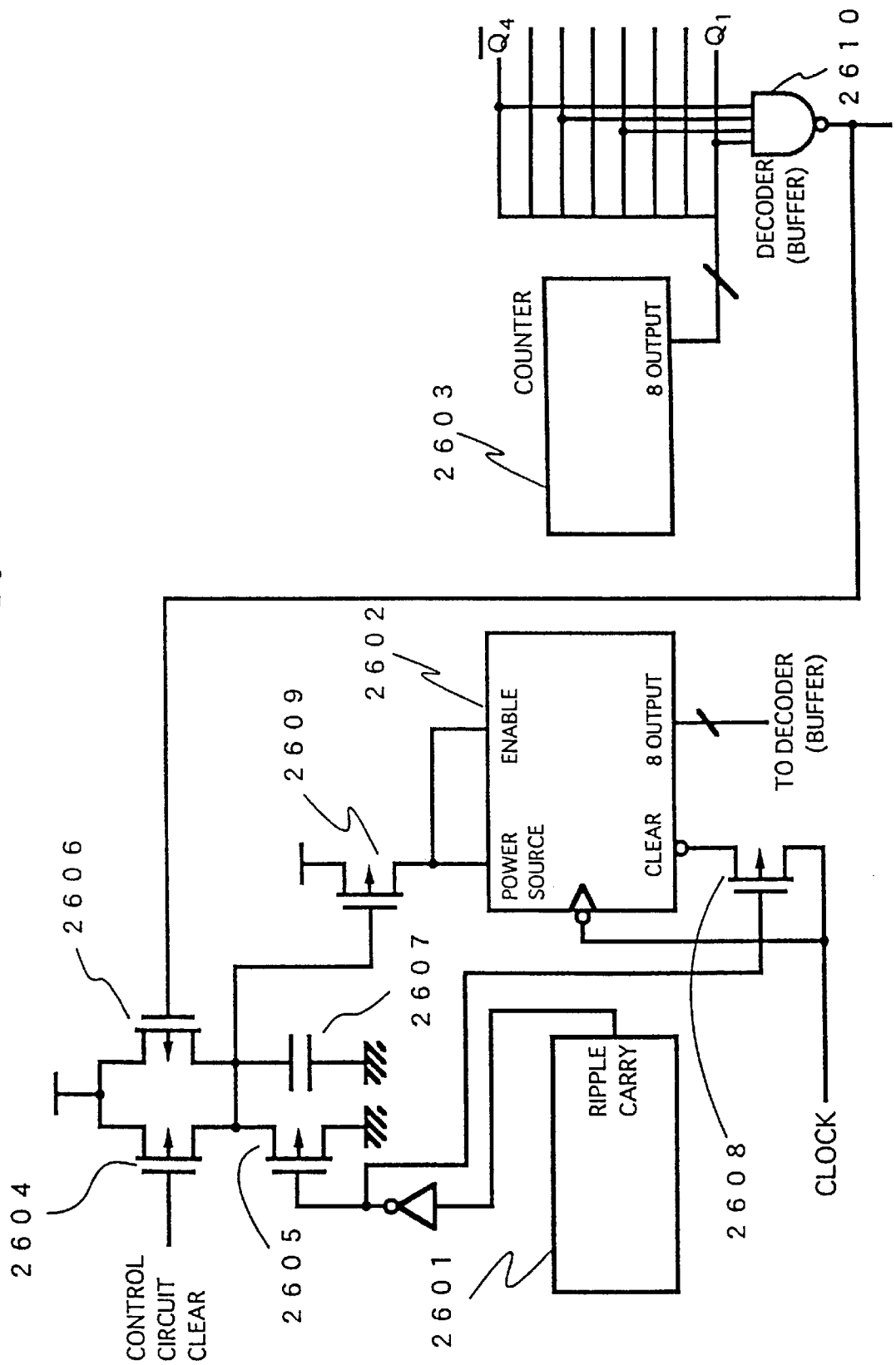
FIG. 26 schematically shows a power supply stopping type counter and a control circuit of the embodiment 6.

FIG. 26 represents the subdivided counter circuit, the decoder circuit, and the control circuit. When a ripple carry produces in an (n−1)th counter circuit 2601, power is started to be supplied to an nth counter circuit 2602. When an (n+1)th counter circuit 2603 starts its counting operation, the supply of power to the nth counter circuit is stopped.

The control circuit is identical to that of the embodiment 5, and is arranged by one conductivity type TFT for initial setting (i.e., P-channel type TFT 2604), a P-channel type TFT 2605 for discharging a capacitor so as to start the supply of power, a P-channel type TFT 2606 for charging a capacitor so as to stop the supply of power, and also a capacitor 2607 for storage purpose. An output value of the nth counter circuit becomes unstable at a time when the power is started to be supplied. As a result, the clear operation is carried out at such a time when a ripple carry of the (n−1)th counter circuit is produced and the power is started to be supplied. A circuit for producing a clear signal is constructed of a P-channel type TFT 2608.

A circuit for supplying the power may be realized by that a P-channel type TFT is series-connected between the source electrode of the P-channel type TFT in FIG. 22 and the power supply (power source) circuit and the supply of power is controlled by this P-channel type TFT. In FIG. 26, P-channel type TFTs which are additionally connected in series are combined and indicated as a P-channel type TFT 2609. An enable signal to the nth counter circuit 2602 is supplied by the P-channel type TFT 2609. The supply of power to the nth counter circuit is stopped by using the output of the decoder circuit 2610 for detecting the minimum output value of the (n+1)th counter circuit.

Figure 27:
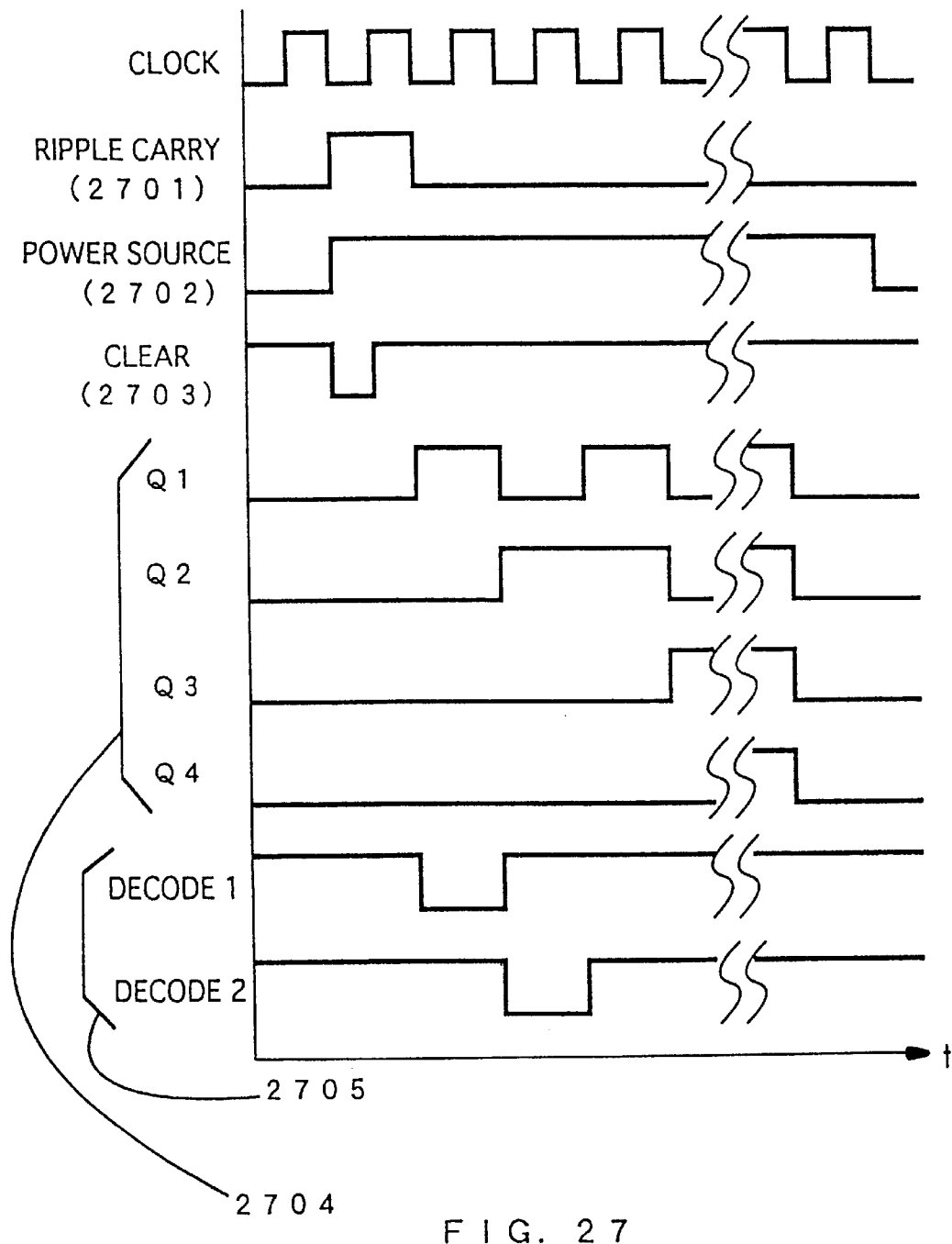
FIG. 27 is a timing chart for showing operations of the counter circuit of the embodiment 6.

FIG. 27 shows a timing chart of the nth counter circuit. Immediately after the power supply (power source) 2701 is turned on, a clear signal 2703 of the nth counter circuit is produced by a ripple carry 2702 of the (n−1)th counter circuit. An output 2704 of the nth counter circuit is input into the decoder circuit to produce a decode signal 2705. In response to next clock pulse when the ripple carry is output, the supply of power to the nth counter circuit is stopped.

With respect to the peripheral driver circuit of this embodiment, a comparison is made of consumption power. The consumed power at a signal register is defined by dividing a squared value of power supply voltage for each resistor by a resistance value. When the address signals are produced to 640 pixels, a 10-bit counter is required. A one bit of counter corresponds to one piece of a J/K flip-flop and a single J/K flip-flop requires 10 gates, so that the number of resisters for connecting the power supply (power source) to the ground with respect to only the J/K flip-flop is 100. Sixteen (16) gates are additionally required, and there is one resistor for connecting the power supply to the ground with respect to one gate. As a result, there is a total of 116 resisters for connecting the power supply and the ground. A resistance value is selected to be 300 KΩ and a power supply voltage is 20 V, assuming that probability is ½ (50%) whether the power supply voltage output or the ground voltage output is produced. The consumption power becomes 77 mW except for the decoder circuit having also the buffer function.

To the contrary, the consumption power according to this embodiment is given as follows. Since the 4-bit counters are sequentially used irrelevant to the number of pixels, it may be considered that the 4-bit counters are normally operated. In other words, there are four J/K flip-flops, and ten resistors are provided in each J/K flip-flop. Since eight gates are required in each J/K flip-flop, a total number of resistors for connecting the power supply and the ground becomes 48. The power supply voltage is selected to be 20 V, and a resistance value thereof is 300 KΩ, assuming that probability is ½ (50%) whether the power supply voltage output or the ground voltage output is produced. From this assumption, the consumption power becomes 32 mW except for the decoder circuit having the buffer function.

In the peripheral driver circuit with only the decoder circuit and the counter circuit, when the number of either the canning lines or the signal lines is increased, the resultant consumption power is increased in a logarithmic manner. However, in this embodiment, the consumption power can be reduced in view of circuit arrangements.

EMBODIMENT 7

In an embodiment 7, there is shown a circuit arrangement that when a pixel is specified, a power supply voltage is set to a necessary value. This also corresponds to a circuit arrangement for lowering a power supply voltage of a circuit portion which does not function. Similar to the embodiment 6, in this embodiment, such a peripheral driver circuit is assumed that a pixel is specified by employing a decoder circuit and a counter circuit. The counter circuit has 6 bit outputs.

Figure 28:
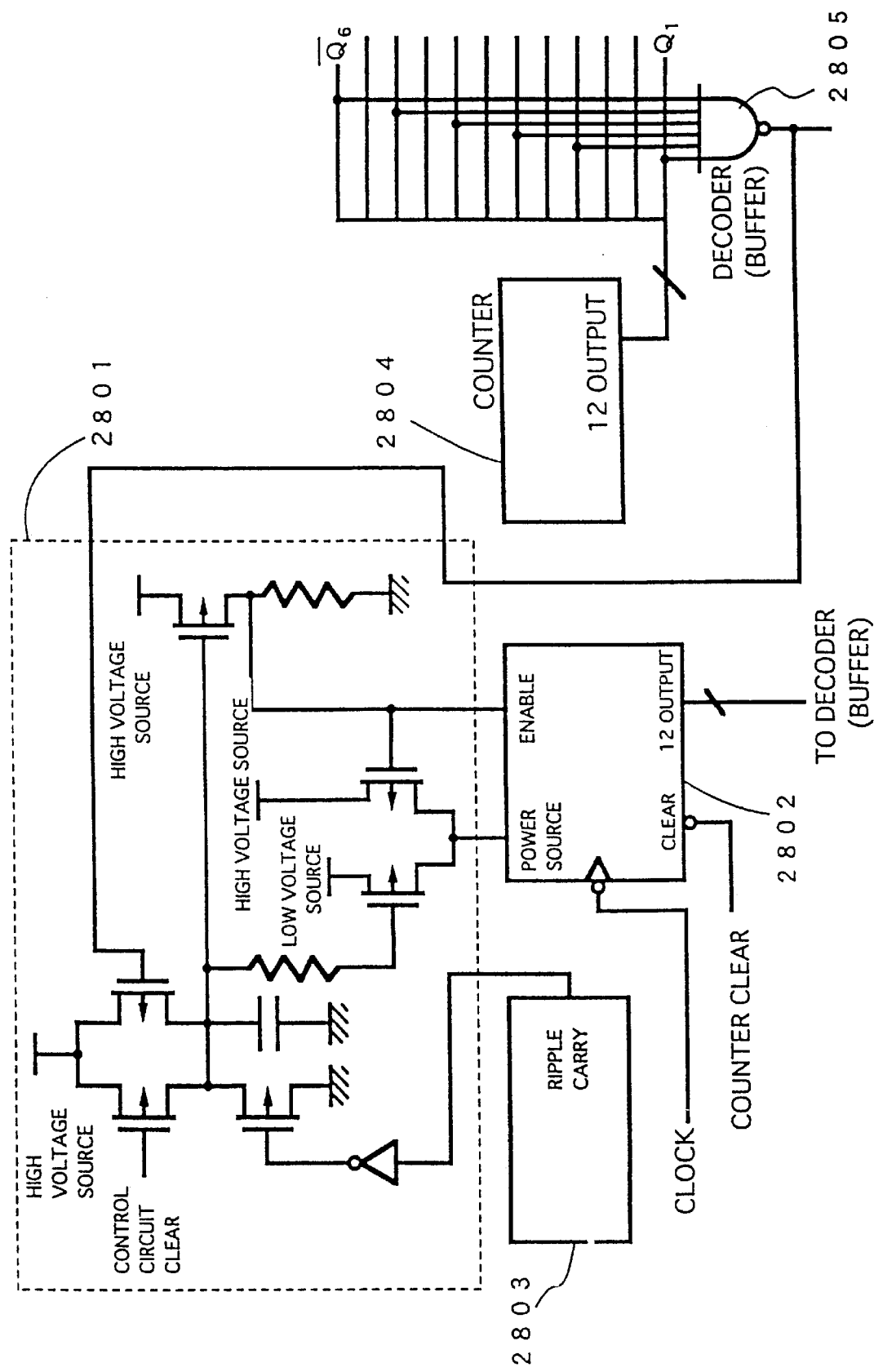
FIG. 28 schematically indicates a,power supply voltage lowering type counter and a control circuit according to an embodiment 7.
Figure 29:
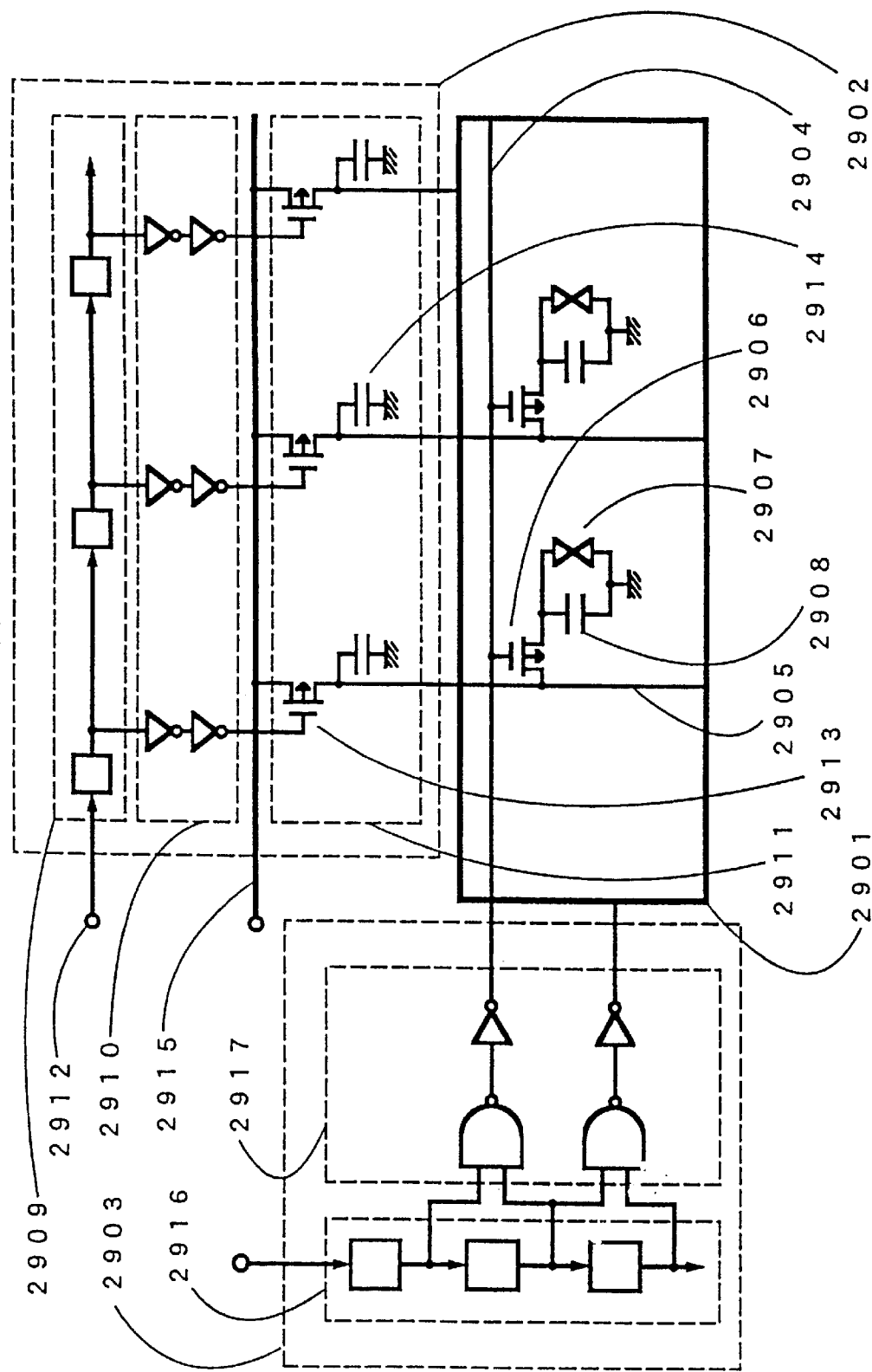
FIG. 29 schematically represents the conventional peripheral driver circuit and display matrix portion for the liquid crystal electro-optical device.
Figure 30A:
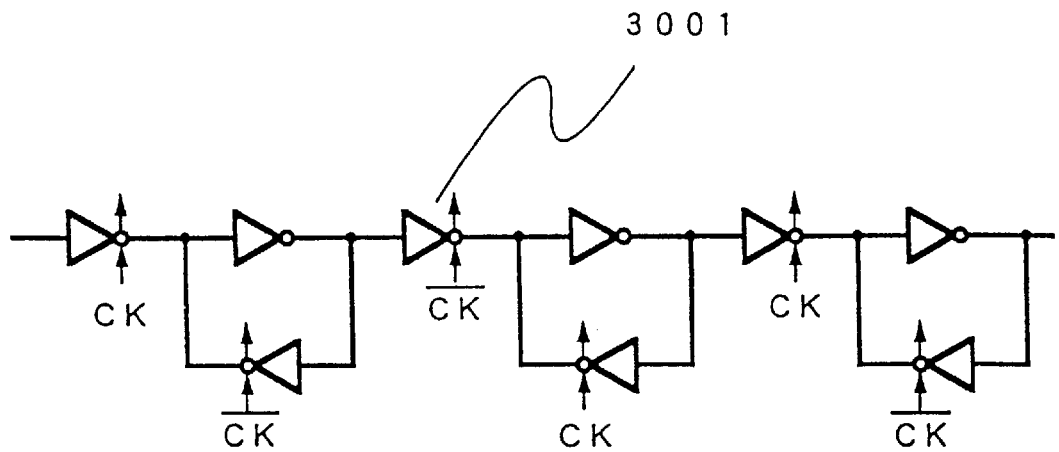
FIG. 30 schematically indicates the clocked inverter structured shift register and the transmission gate structured shift register.
Figure 30B:
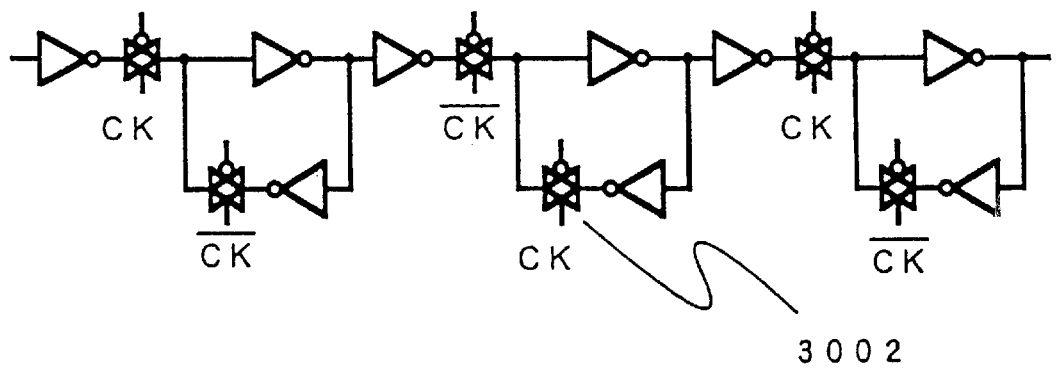
Figure 31:
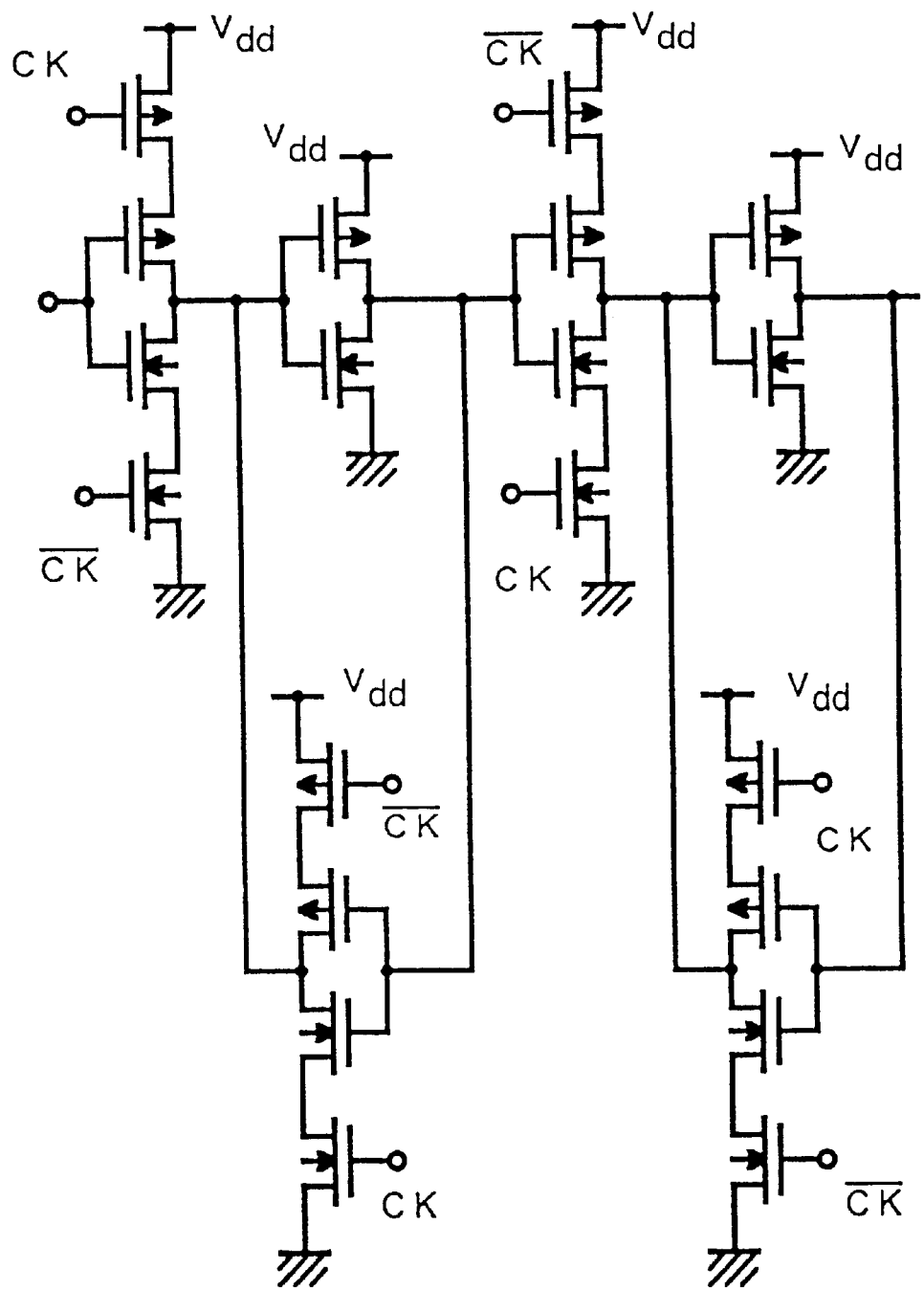
FIG. 31 schematically shows the clocked inverter structured shift register of the CMOS circuit.

FIG. 28 shows a circuit arrangement. A control circuit 2801 has an arrangement similar to that of the embodiment 5. A ripple carry of an (n−1)th counter circuit 2803 is employed as a signal for starting a supply of power to an nth counter circuit 2802. An output of a decoder circuit 2805 for detecting a minimum output value of an (n+1)th counter circuit 2804 is used as a signal for stopping a supply of power to the nth counter circuit. A signal for controlling a power supply voltage capable of realizing low consumption power is used as an enable signal of the nth counter circuit. Under a clear state, the nth counter circuit waits that the enable signal subsequently becomes active. As a consequence, even when the power supply voltage is changed, the clear operation need not be executed.

With respect to the peripheral driver circuit of this embodiment, a comparison is made of consumption power. The consumed power at a single register is defined by dividing a squared value of power supply voltage for each resistor by a resistance value. When the address signals are produced to 640 pixels, a 10-bit counter is required. A one bit of the counter corresponds to one pixel of a J/K flip-flop, and a single J/K flip-flop requires 10 gates, so that there are 100 pieces of resistors for connecting the power supply to the ground only in the J/K flip-flop. Sixteen (16) gates are additionally required, and there is one resistor for connecting the power supply to the ground with respect to one gate. As a result, there is a total of 116 resistors for connecting the power supply and the ground. A resistance value is selected to be 300 KΩ and a power supply voltage is 20 V, assuming that probability is ½ (50%) whether the power supply voltage output,or the ground voltage output is produced. The consumption power becomes 77 mW except for the decoder circuit having also the buffer function.

To the contrary, the consumption power according to this embodiment is given as follows. Eleven (11) 6-bit counters are required with respect to 640 pixels. A voltage of 20 V capable of driving the liquid crystal is applied to one 6-bit counter, whereas a voltage of 5 V capable of supplying low consumption power is applied to the remaining ten 6-bit counters. In a 6-bit counter circuit, there are six J/K flip-flops, and ten resistors are provided in one J/K flip-flop. Since 12 gates are required in each J/K flip-flop, a total number of resistors for connecting the power supply and the ground becomes 72. It is assumed that a resistance value thereof is 300 KΩ, and the probability is ½ (50%) whether the power supply voltage output or the ground voltage output is produced. From this assumption, the consumption power becomes 62 mW except for the decoder circuit having the buffer function.

As previously explained in the embodiments 5 to 7, according to the circuit arrangement of the present invention, the power is supplied only to the required circuit portion in the peripheral driver circuit to be driven, so that the consumption power of the overall peripheral driver circuit in the liquid crystal electro-optical device can be reduced. Also, the high voltage is applied to the required circuit portion of the peripheral driver circuit, and the low voltage is applied to the unnecessary circuit portion thereof, so that the consumption power of the overall peripheral driver circuit of the liquid crystal electro-optical device can be reduced.

What is claimed is:

1. A semiconductor device comprising:
    a plurality of pixels arranged in a matrix form;
    a driver circuit for driving said pixels said driver circuit comprising:
        a shift register circuit having a serial-connected plurality of registers; and
        a power supply circuit having a plurality of control circuits connected to each of said registers to supply power to each of said registers;
        wherein when an input signal to said shift register circuit is held in nth register of said shift register circuit, supply of the power to registers except the nth, (n−1)th and (n+1)th register of said shift register circuit is stopped (n is an integer).

2. The semiconductor device of claim 1 wherein each of said registers includes a P-channel type thin film transistor and a resistor.

3. The semiconductor device of claim 1 wherein the power supply circuit controls power supply to said registers in accordance with outputs of said registers.

4. The semiconductor device of claim 1 wherein each of said control circuits includes a P-channel type thin film transistor, a resistor, and a capacitor.

5. The semiconductor device of claim 1 wherein a consumption power of said power supply circuit is no larger than that of said shift register circuit.

6. A semiconductor device comprising:
a plurality of pixels arranged in a matrix form; and
a driver circuit for driving said pixels, said driver circuit comprising:
a shift register circuit having a serial-connected plurality of registers; and
a power supply circuit having a plurality of control circuits connected to each of said registers to supply power to each of said registers;
wherein when an input signal to said shift register circuit is held in nth register of said shift register circuit, supply of the power to registers except the nth, (n−1)th and (n+1)th register of said shift register circuit is stopped (n is an integer), and
wherein each of said registers is activated prior to a half period of a basic clock before said input signal is reached.

7. The semiconductor device of claim 6 wherein each of said registers includes a P-channel type thin film transistor and a resistor.

8. The semiconductor device of claim 6 wherein said power supply circuit controls power supply to said registers in accordance with outputs of said registers.

9. The semiconductor device of claim 6 wherein each of said control circuits includes a P-channel type thin film transistor, a resistor, and a capacitor.

10. The semiconductor device of claim 6 wherein a consumption power of said power supply circuit is no larger than that of said shift register circuit.

11. A semiconductor device comprising:
an active matrix circuit;
a driver circuit for driving said active matrix circuit, wherein said driver circuit comprising:
a shift register circuit having a serial-connected plurality of registers; and
a power supply circuit having a plurality of control circuits connected to each of said registers to supply power to each of said registers;
wherein when an input signal to said shift register circuit is held in nth register of said shift register circuit, supply of the power to registers except the nth, (n−1)th and (n+1)th register of said shift register circuit is stopped (n is an integer).

12. The semiconductor device of claim 11 wherein each of said registers includes a P-channel type thin film transistor and a resistor.

13. The semiconductor device of claim 11 wherein said power supply circuit controls power supply to said registers in accordance with outputs of said registers.

14. The semiconductor device of claim 11 wherein each of said control circuits includes a P-channel type thin film transistor, a resistor, and a capacitor.

15. The semiconductor device of claim 11 wherein a consumption power of said power supply circuit is no larger than that of said shift register circuit.

16. The semiconductor device of claim 11 wherein said active matrix circuit and said driver circuit are formed over a substrate.

17. A semiconductor device comprising:
an active matrix circuit;
a driver circuit for driving said active matrix circuit, wherein said driver circuit comprising:
a shift register circuit having a serial-connected plurality of registers; and
a power supply circuit having a plurality of control circuits connected to each of said registers to supply power to each said registers;
wherein when an input signal to said shift register circuit is held in nth register of said shift register circuit, supply of the power to registers except the nth, (n−1)th and (n+1)th register of said shift register circuit is stopped (n is an integer), and
wherein each of said registers is activated prior to a half period of a basic clock before said input signal is reached.

18. The semiconductor device of claim 17 wherein each of said registers includes a P-channel type thin film transistor and a resistor.

19. The semiconductor device of claim 17 wherein said power supply circuit controls power supply to said registers in accordance with outputs of said registers.

20. The semiconductor device of claim 17 wherein each of said control circuits includes a P-channel type thin film transistor, a resistor, and a capacitor.

21. The semiconductor device of claim 17 wherein a consumption power of said power supply circuit is no larger than that of said shift register circuit.

22. The semiconductor device of claim 17 wherein said active matrix circuit and said driver circuit are formed over a substrate.

23. A driving method of a shift register in a driver circuit of an active matrix display device, said shift register comprising a plurality of series connected registers, said driving method comprising the steps of:
shifting an input signal from an (n−1)th register to an n-th register;
sending an output signal from said n-th register to a control circuit in response to said input signal;
generating a first control signal and a second control signal by said control circuit in response to said output of said n-th register;
inputting one of the first and second control signals to an (n−2)th register whereby a power supply to the (n−2)th register is stopped; and
inputting the other one of the first and second control signals to an (n+1)th register whereby a power supply to the (n+1)th register is started.

* * * * *